(12) United States Patent
Calero et al.

(10) Patent No.: US 9,941,684 B2
(45) Date of Patent: Apr. 10, 2018

(54) PHASE AND GROUND PROTECTION USING TILT-LIMITED ADAPTIVE QUADRILATERAL CHARACTERISTIC

(71) Applicant: Schweitzer Engineering Laboratories, Inc., Pullman, WA (US)

(72) Inventors: Jorge Fernando Calero, Coral Springs, FL (US); Armando Guzman-Casillas, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 272 days.

(21) Appl. No.: 14/710,232

(22) Filed: May 12, 2015

(65) Prior Publication Data
US 2016/0334469 A1    Nov. 17, 2016

(51) Int. Cl.
*G01R 31/40* (2014.01)
*H02H 3/04* (2006.01)
*G01R 19/25* (2006.01)
*H02H 3/40* (2006.01)
*H02H 7/26* (2006.01)

(52) U.S. Cl.
CPC ......... *H02H 3/042* (2013.01); *G01R 19/2513* (2013.01); *H02H 3/40* (2013.01); *H02H 3/402* (2013.01); *H02H 7/26* (2013.01)

(58) Field of Classification Search
CPC ............................ G01R 1/0416; G01R 1/0433; G01R 1/06733; G01R 1/0466; G01R 1/06738; G01R 31/40; G01R 19/2513; H05K 7/1061; H05K 7/10; H01R 13/2421; H01R 2001/20; H02H 1/0092; H02H 3/40; H02H 3/402; H02H 3/00
See application file for complete search history.

(56) References Cited

U.S. PATENT DOCUMENTS

| | | |
|---|---|---|
| 4,342,064 A | 7/1982 | Wilkinson |
| 5,140,492 A | 8/1992 | Schweitzer, III |
| 5,796,258 A | 8/1998 | Yang |
| 6,239,959 B1 | 5/2001 | Alexander |
| 6,434,715 B1 | 8/2002 | Andersen |

(Continued)

OTHER PUBLICATIONS

Armando Guzman, Joe Mooney, Gabriel Benmouyal, Normann Fischer, Transmission Line Protection System for Increasing Power System Requirements Apr. 8, 2002.

(Continued)

*Primary Examiner* — Jermele M Hollington
(74) *Attorney, Agent, or Firm* — Richard M. Edge

(57) ABSTRACT

A quadrilateral distance module may be used to detect faults in an electrical power system. A resistive coverage of the quadrilateral distance module may be defined by an adaptive resistance blinder. Tilt of the adaptive reactance element and resistance blinders may be limited. When an angle between the sequence-component based, current polarizing quantity and the element loop current does not exceed a predetermined angle threshold, the sequence-component based polarizing quantity may be used. Otherwise, the element loop current may be used to limit the tilt. Fault detection may comprise comparing both the adaptive resistance blinders for forward and reverse load flow conditions to power system stimulus and detecting a fault when the stimulus satisfy either blinder.

28 Claims, 11 Drawing Sheets

(56) References Cited

U.S. PATENT DOCUMENTS

| | | | |
|---|---|---|---|
| 6,525,543 B1* | 2/2003 | Roberts | H02H 3/343 324/522 |
| 6,601,001 B1 | 7/2003 | Moore | |
| 6,662,124 B2 | 12/2003 | Schweitzer, III | |
| 6,845,333 B2 | 1/2005 | Anderson | |
| 8,410,785 B2 | 4/2013 | Calero | |
| 8,675,327 B2 | 3/2014 | Kasztenny | |
| 9,257,827 B2 | 2/2016 | Calero | |
| 2007/0086134 A1 | 4/2007 | Zweigle | |
| 2008/0239602 A1 | 10/2008 | Kasztenny | |
| 2011/0068803 A1* | 3/2011 | Calero | H02H 3/402 324/511 |
| 2014/0236502 A1 | 8/2014 | Calero | |

OTHER PUBLICATIONS

Fernando Calero, Distance Elements: Linking Theory with Testing, Oct. 21, 2008.

E. O. Schweitzer, III, Jeff Roberts, Distance Relay Element Design, Apr. 1993.

Gabriel Benmouyal, Jeff Roberts, Superimposed Quantities: Their True Nature and Application in Relays, Oct. 1999.

Solveig Ward, Comparison of Quadrilateral and Mho Distance Characteristic, Oct. 26, 1999.

Jeff Roberts, Edmund O. Schweitzer, III, Renu Aurora, Ernie Poggi, Limits to the Sensitivity of Ground Directional and Distance Protection, May 15, 1997.

PCT/US2010/049409 International Search Report and Written Opinion of the International Searching Authority, dated Nov. 9, 2010.

Fernando Calero, Armando Guzman, Gabriel Benmouyal, Adaptive Phase and Ground Quadrilateral Distance Elements, Dec. 14, 2009.

James Hubertus, Joe Mooney, George Alexander, Application Considerations for Distance Relays on Impedance-Grounded Systems, Sep. 12, 2007.

Joe Mooney, P.E., Jackie Peer, Application Guidelines for Ground Fault Protection, 1997.

\* cited by examiner

US 9,941,684 B2

PHASE AND GROUND PROTECTION USING TILT-LIMITED ADAPTIVE QUADRILATERAL CHARACTERISTIC

RELATED APPLICATION

<None>

TECHNICAL FIELD

This disclosure relates to power system protection, and more particularly, to a quadrilateral distance module incorporating adaptive tilt-limited resistance blinder and reactance element.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
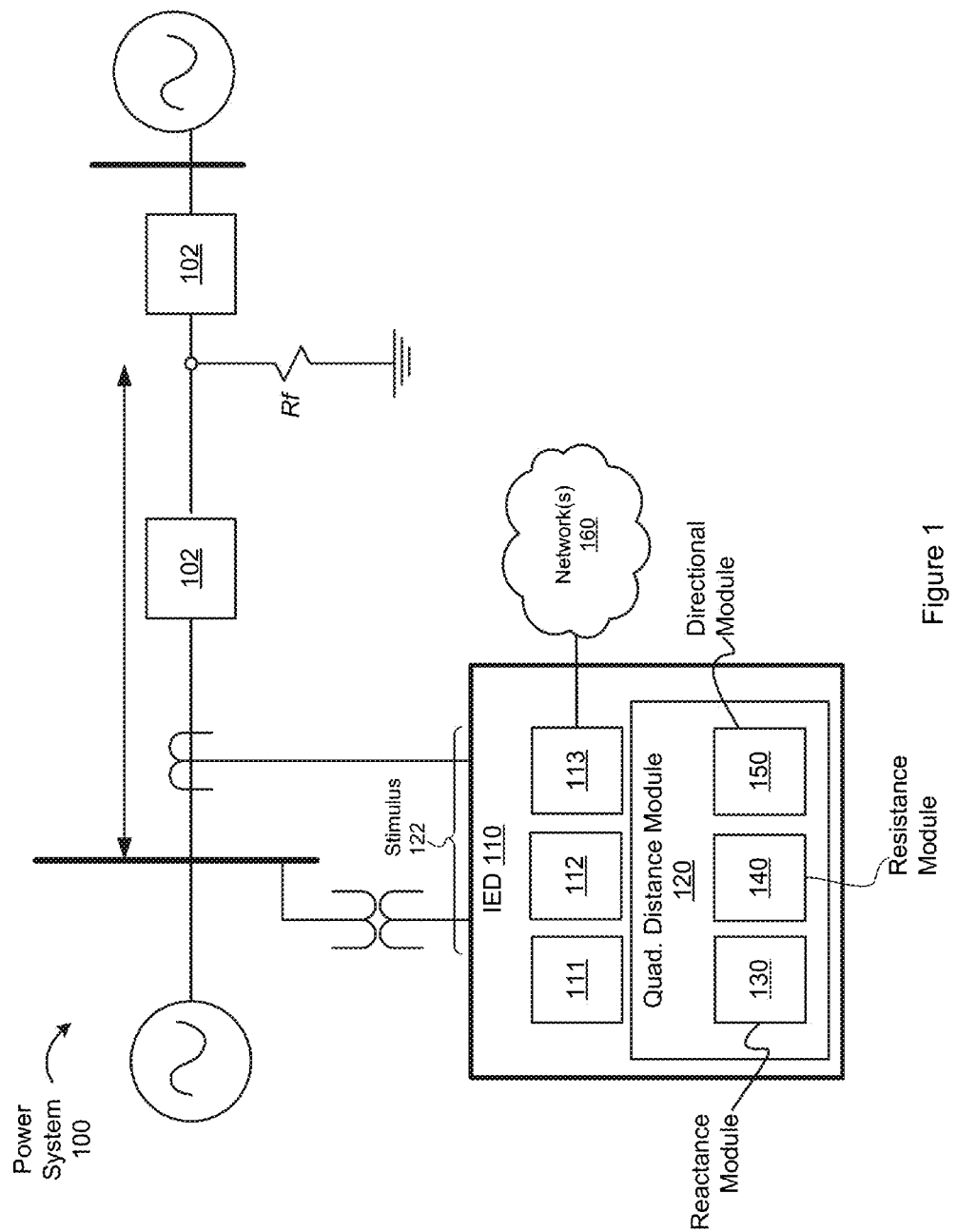
FIG. 1 illustrates an electrical power system comprising an IED implementing a quadrilateral distance module.

An IED, such as a protective relay, may monitor and protect an electrical power system in the event of power system faults. As used herein, the term IED may refer to any device that monitors, controls, automates, and/or protects monitored equipment within the power system. Typically, such IEDs are implemented and/or comprise a computing device that includes a processor, memory, machine-readable non-transitory storage media, input/output interfaces, and the like. IEDs are, for example, differential relays, distance relays, directional relays, feeder relays, overcurrent relays, voltage regulator controls, voltage relays, breaker failure relays, generator relays, motor relays, automation controllers, remote terminal units, bay controllers, meters, recloser controls, communications processors, computing platforms, programmable logic controllers (PLCs), programmable automation controllers (PALs), input and output modules, and the like. The term IED may be used interchangeably to describe an individual IED or a system comprising multiple IEDs.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 depicts one example of a power system 100 comprising an IED 110, which may be configured to monitor and/or protect the power system 100. As discussed above, the IED 110 may comprise and/or be implemented in conjunction with a computing device. Accordingly, the IED 110 may include a processor 111, which may comprise one or more general purpose processors, special purposes processors, application-specific integrated circuits, programmable logic elements (e.g., FPGAs), or the like. The IED 110 may further comprise non-transitory machine-readable storage media 112, which may include one or more disks, solid-state storage (e.g., Flash memory), optical media, or the like. The IED 110 may be communicatively coupled to one or more networks 160 using via one or more communication interfaces 113. The networks 160 may include special-purpose networks for monitoring and/or controlling the electrical power system 100 (e.g., SCADA networks, or the like). The networks 160 may further include general purpose communication networks, such as a TCP/IP network, or the like. The communication interface 113 may include wired and/or wireless communication interfaces (e.g., serial ports, RJ-45, IEEE 802.11 wireless network transceivers, etc.). In some embodiments, the IED 110 may include human-machine interface (HMI) components (not shown), such as a display, input devices, and so on.

Components of the IED 110, such as the quadrilateral distance module 120, reactance module 130, resistance module 140, and/or directional module 150 (described below) may be implemented using components of the IED 110. For example, the modules 120, 130, 140, and/or 150 may be implemented (in part) using instructions stored on the non-transitory machine-readable storage medium 112, which may be operable on the processor 111. Alternatively, or in addition, portions of the components 120, 130, 140, and/or 150 may be implemented using dedicated hardware modules (e.g., circuit components).

The IED 110 may be communicatively coupled to the power system 100 through one or more current transformers, voltage measurement devices, the communication interface 113, or the like. The IED 110 may receive stimulus 122 from the power system 100. The stimulus 122 may be received via the measurement devices described above and/or via the communication interface 113 (e.g., from another IED or other monitoring device (not shown) in the electrical power system 100). The stimulus 122 may include, but is not limited to: current measurements, voltage measurements, and the like. The stimulus 122 may comprise phasor measurements (e.g., measurements comprising a magnitude and angle).

The IED 110 may comprise and/or implement a quadrilateral distance module 120 configured to detect fault conditions using an impedance function (e.g., comparing power system 100 impedance levels to a quadrilateral characteristic). The quadrilateral distance module 120 may comprise a reactance module 130, resistance module 140, and/or a directional module 150. The reactance module 130 and resistance module 140 may define one or more quadrilateral characteristics (e.g., quadrilateral characteristic 200 of FIG. 2A), to which stimulus received from the power system 100 may be compared. When the power system 100 stimulus satisfy operating conditions of the quadrilateral distance module 120 (e.g., fall within an operating region of one or more of the quadrilateral characteristics), the quadrilateral distance module 120 (and/or IED 110) may detect a fault condition and may operate (e.g., trip one or more breakers 102, operate one or more switches, assert one or more alarms, issue one or more notifications, or the like).

The reactance module 130 may determine an impedance coverage of the quadrilateral distance module 120, whereas the resistance module 140 may determine the resistive coverage (e.g., resistance coverage may determine the fault resistance (RP that can be detected). The reactance module 130 may be adaptive to address overreach or underreach due to Rf and/or load flow conditions (e.g., forward load flow, reverse load flow, etc.). The resistance module 140 may generate adaptive resistance blinders to detect as much Rf as possible.

As discussed below, adaptation of a reactance element (generated by the reactance module 130) may comprise "tilting" the adaptive reactance element with respect to a fixed characteristic of a reactance element (e.g., modifying the impedance coverage of the quadrilateral characteristic). Adaptation of a resistance blinder calculated by the resistance module 140 may comprise tilting the resistance blinder with respect to a fixed characteristic of a resistance blinder using a polarizing quantity (e.g. negative sequence-polarization, I1+I2 polarization, or another polarizing quantity). The tilt may change the resistive coverage of the quadrilateral characteristic, which may provide additional Rf coverage. In some embodiments, a quadrilateral characteristic may comprise a plurality of adaptive resistance blinders operating in parallel; an adaptive resistance blinder (using negative sequence polarization or the like) may provide improved resistance coverage in forward load flow conditions, whereas another adaptive resistance blinder (using I1+I2 polarization or the like) may provide improved resistance coverage in reverse load flow conditions.

Figure 2A:
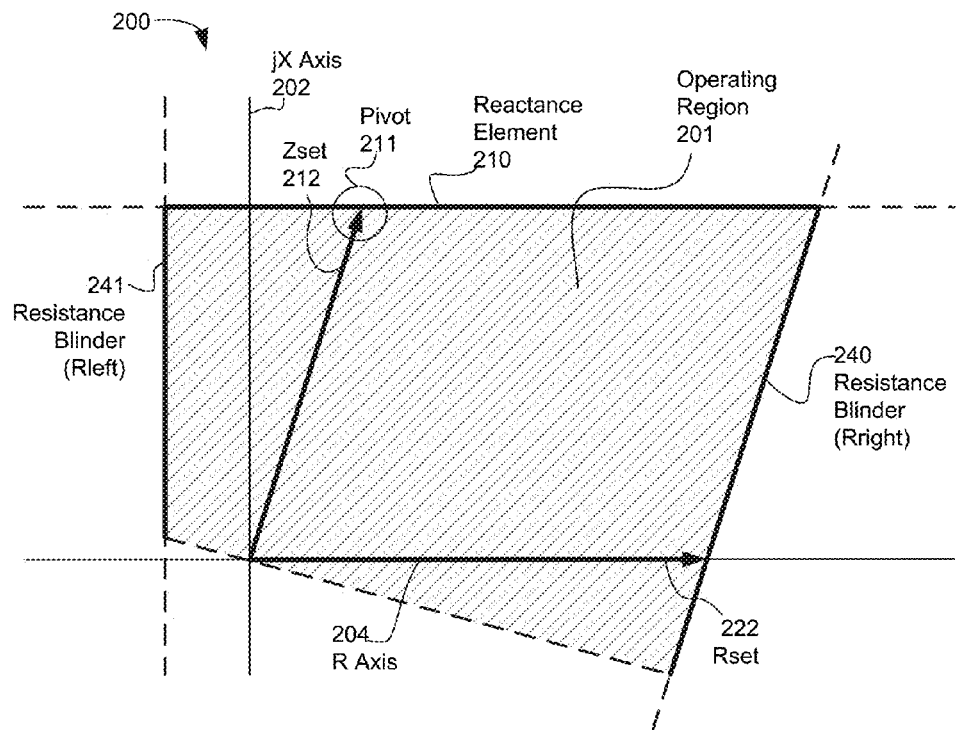
FIG. 2A illustrates an example of a quadrilateral characteristic.

FIG. 2A depicts one example of a quadrilateral characteristic 200. The quadrilateral characteristic may be implemented by an IED and/or quadrilateral distance module, such as the IED 110 and quadrilateral distance module 120 of FIG. 1.

The quadrilateral characteristic 200 may define an operating region 201 to which a power system stimulus may be compared. A quadrilateral distance module implementing the characteristic 200 may operate when the power system stimulus satisfies the quadrilateral characteristic 200 (e.g., impedance falls within the operating region 201).

The impedance reach of the operating region 201 along the line impedance defined by the reactance element 210. The Applicants have determined (by testing and experience) that certain power system conditions, such as forward load flow, reverse load flow, and/or Rf may cause misoperation. For example, external faults with high Rf may enter the operating area 201. Accordingly, in some embodiments, the characteristic 200 may comprise an adaptive reactance element 230 (as depicted in FIGS. 2B and 2D-2E).

Figure 2B:
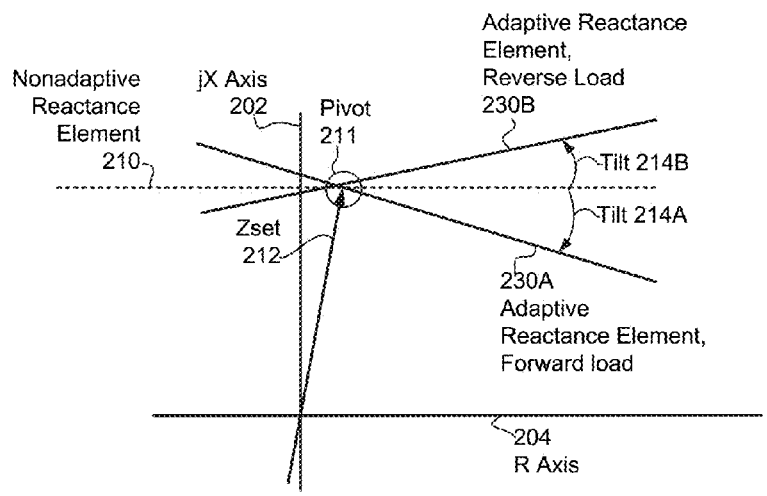
FIG. 2B illustrates an example of an adaptive reactance element.

Referring to FIG. 2B, an adaptive reactance element (shown as 230A and 230B) may be configured to "tilt" with respect to the line impedance. The tilt may be a function of the line loading, or the like. In some embodiments, the reactance element 230 may be tilted using a polarizing quantity, which may be derived from a negative-sequence current, or other polarizing quantity (e.g., I1+I2, I1+I0, I0, polarization, etc.).

The adaptive reactance element 230 (shown as 230A and 230B) may pivot about a pivot point 211, which may be defined by an impedance setting (Zset) 212. The impedance setting 212 may be derived from properties and/or characteristics of the power system, such as line impedance and the like, and may be selected according to testing and/or experience.

FIG. 2B depicts examples of adaptive reactance elements 230A and 230B that are tilted about the pivot 211 of the impedance setting Zset 212. The tilt 214A and/or 214B may be determined using a polarizing quantity (e.g., negative-sequence polarization, I1+I2 polarization, or the like), which may adapt the reactance element 230A and/or 230B for forward and/or reverse load flow conditions. The adaptive reactance element 230A is adapted by tilt 214A for a forward load flow condition, and the adaptive reactance element 230B is adapted by tilt 214B for a reverse load flow condition. As shown in FIG. 2B, the adaptive reactance elements 230A and/or 230B may modify the operating region 201 of the quadrilateral characteristic 200 depicted in FIG. 2A.

Figure 3A:
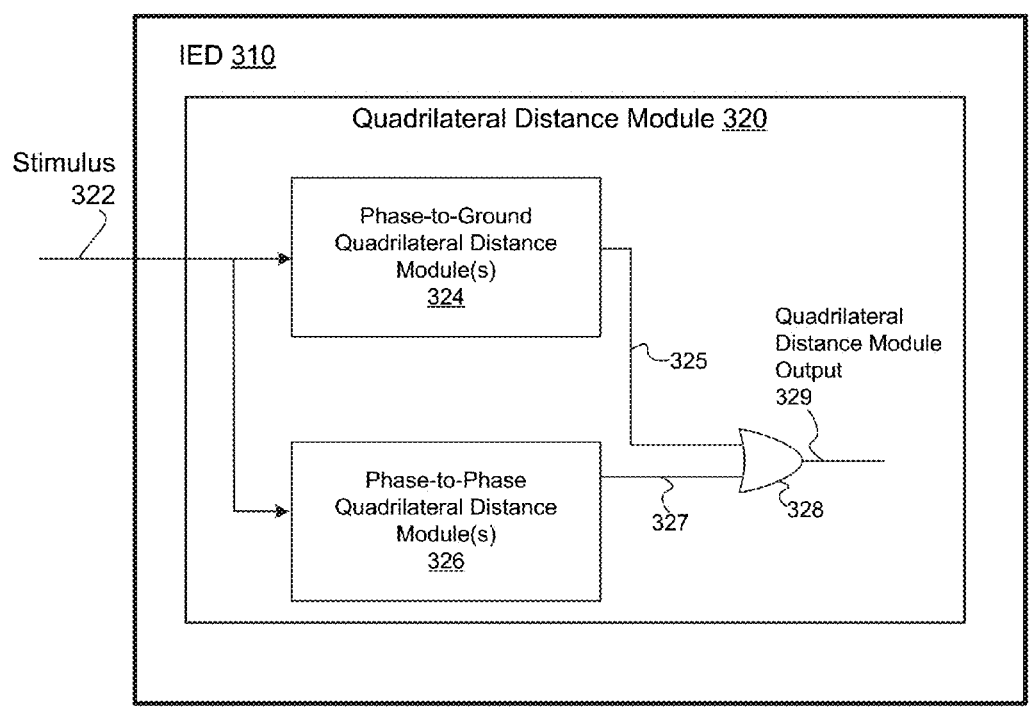
FIG. 3A illustrates an embodiment of an IED comprising a quadrilateral distance module.
Figure 3B:
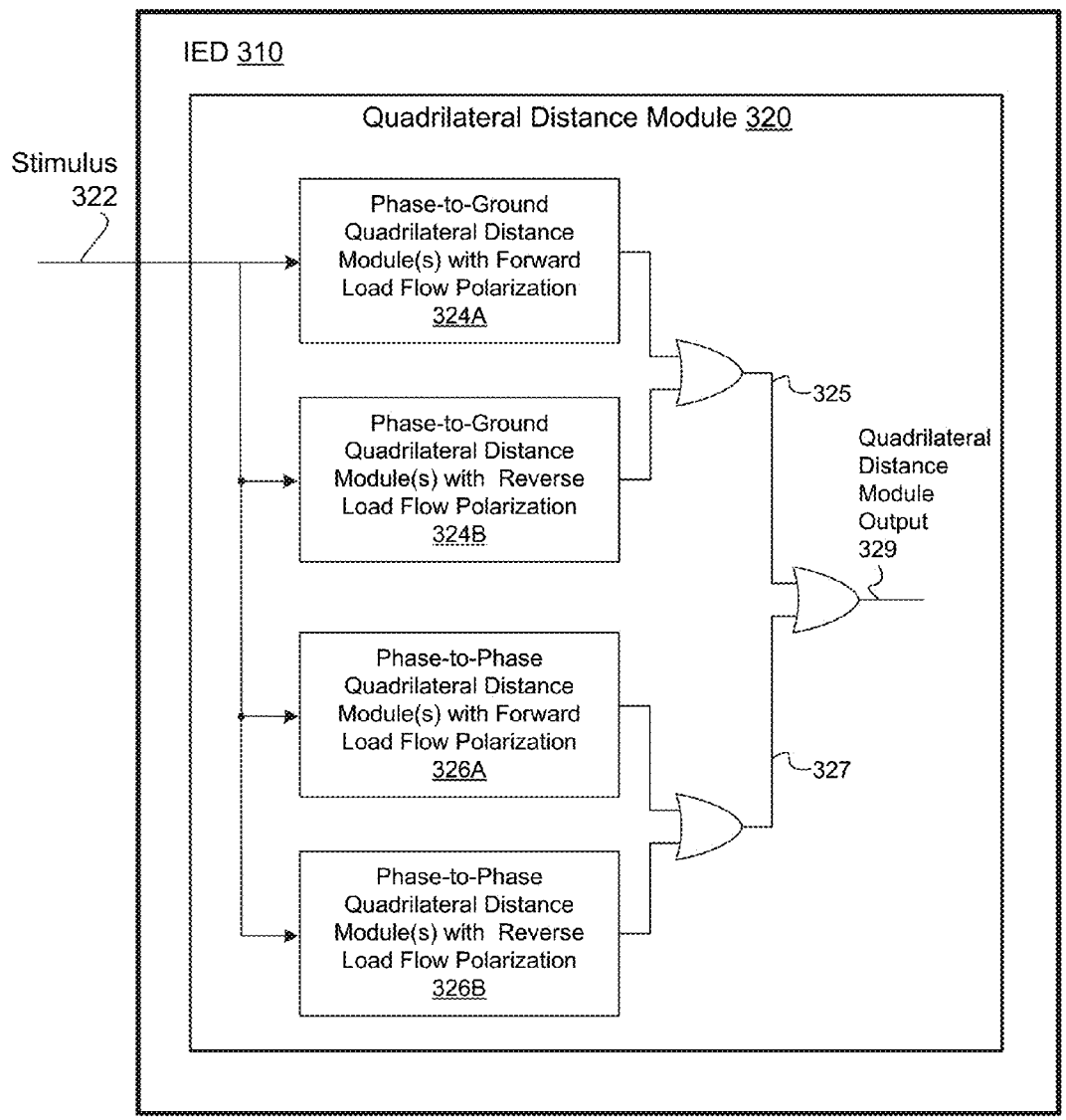
FIG. 3B illustrates an embodiment of an IED comprising a quadrilateral distance module.

In some embodiments, an adaptive reactance element may be derived from an operating quantity and a polarizing quantity. In multi-phase systems (e.g., three-phase systems), the operating and polarizing quantities may be calculated on a per-phase basis as discussed below in conjunction with Equations 1-5. In some embodiments, a quadrilateral distance module (e.g., module 120) may comprise a phase-to-ground quadrilateral distance module operating in parallel with a phase-to-phase quadrilateral distance module (e.g., as depicted in FIGS. 3A and 3B). Accordingly, the reactance module 130 may be configured to generate adaptive reactance elements for a phase-to-ground module (ground adaptive reactance elements) and adaptive reactance elements for a phase-to-phase module (phase adaptive reactance elements).

The operating quantity for an A-phase-to-ground adaptive reactance element (SX1_AG) may be calculated per Equation 1:

$$SX1\_AG = VA - ZsetG \cdot (IA + k0 \cdot 3 \cdot I0) \quad \text{Eq. 1}$$

In Equation 1, VA is an A-phase voltage, IA is an A-phase current, k0 is a zero-sequence compensating factor, and I0 is a zero-sequence current. The zero-sequence compensating factor k0 may be derived from line impedance quantities per Equation 2:

$$k0 = \frac{Z_{L0} - Z_{L1}}{3 \cdot Z_{L1}} \quad \text{Eq. 2}$$

The polarizing quantity for the A-phase-to-ground reactance element (SX2_AG) may be calculated per Equation 2:

$$SX2\_AG = (IA2)e^{jT} \quad \text{Eq. 3}$$

In Equation 3, IA2 is an A-phase negative-sequence current, and T is the homogeneity factor related to the impedances of the power system (e.g., derived from line and system impedances and/or set by calculation, testing and/or experience). Although Equation 3 as written, above, uses a negative-sequence polarizing quantity (I2), other polarizing quantities could be used under the teachings of this disclosure. For example, Equation 3 could be adapted to use zero-sequence current (I0) under certain conditions (e.g., when reliable negative-sequence current is not available), or the like.

As would be recognized by one of skill in the art, Equations 1-3 could be adapted to calculate phase-to-ground adaptive reactance elements for the B and/or C phases (e.g., SX1_BG, SX2_BG, SX1_CG, and/or SX2_CG).

Figure 3C:
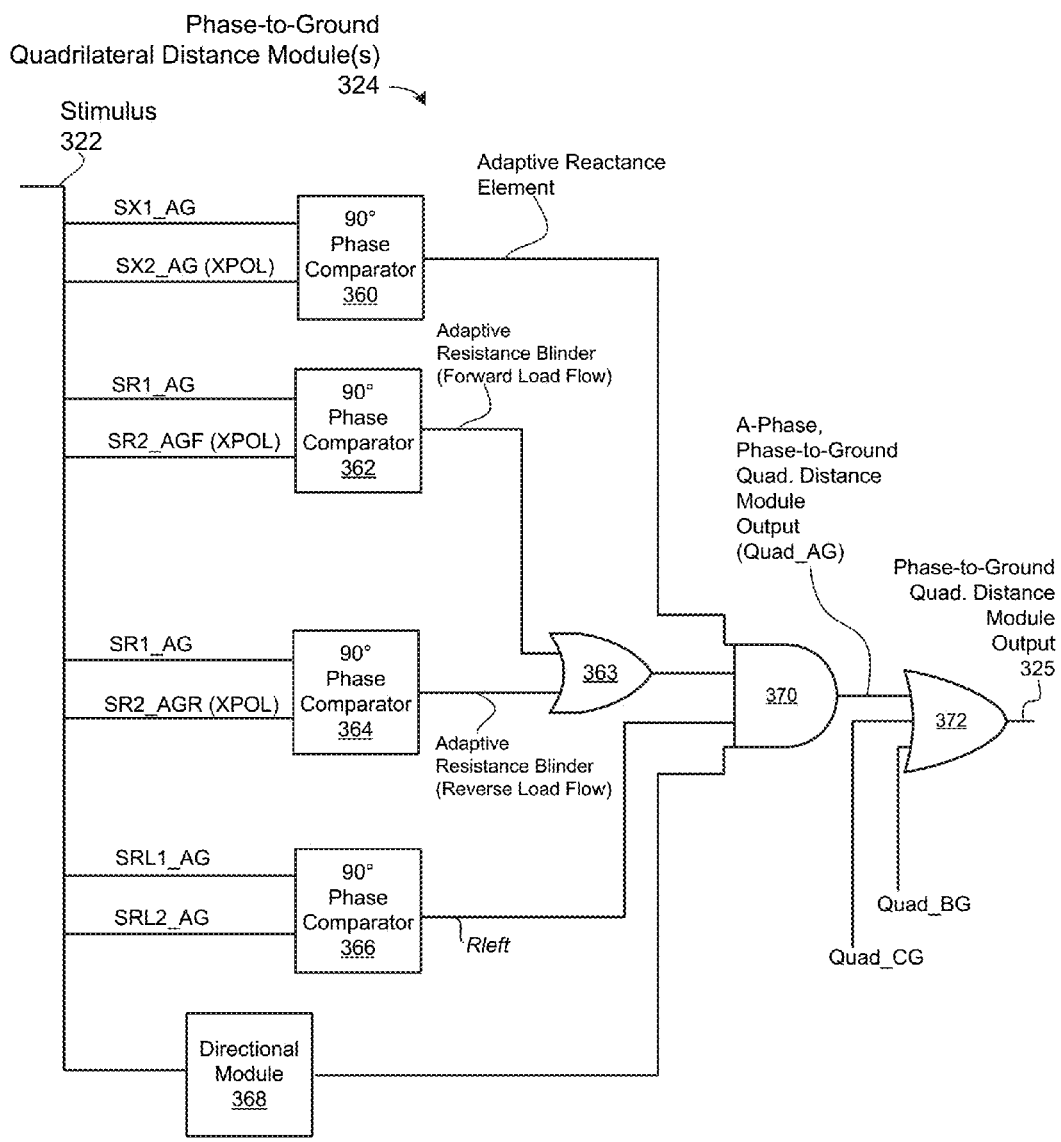
FIG. 3C illustrates one embodiment of a phase-to-ground quadrilateral distance module.
Figure 3D:
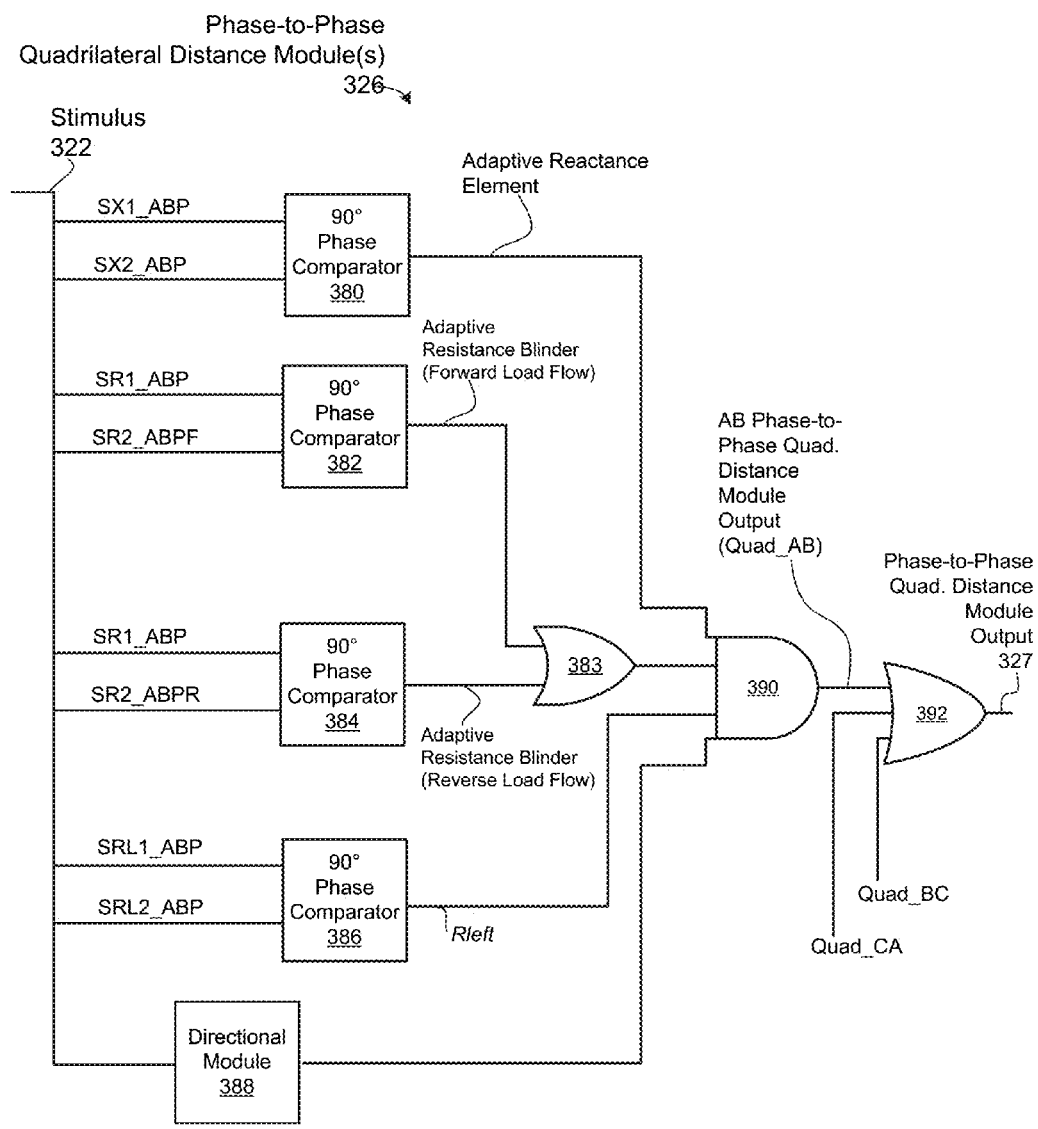
FIG. 3D illustrates one embodiment of a phase-to-phase quadrilateral distance module.

Respective operating and polarizing quantities may be combined to form a ground adaptive reactance element; the combination may be implemented using various techniques, such as a phase comparator (e.g., a 90° phase comparator as depicted in FIGS. 3C and 3D), or the like.

Separate adaptive reactance elements for a phase-to-phase quadrilateral distance module may be calculated in parallel with the phase-to-ground adaptive reactance elements described above. In some embodiments, a phase adaptive reactance element for an A-phase-to-B-phase module may be calculated using an A-phase-to-B-phase operating quantity (SX1_ABP) and an A-phase-to-B-phase polarizing quantity (SX2_ABP) per Equations 4 and 5:

$$SX1\_ABP = (VA - VB) - ZsetP \cdot (IA - IB) \quad \text{Eq. 4}$$

$$SX2\_ABP = (IA2 - IB2)e^{jT} \quad \text{Eq. 5}$$

In Equation 5, IA2 is an A-phase negative-sequence current, and IB2 is a B-phase negative-sequence current. As in Equation 3, the polarizing quantity of Equation 5 is derived from negative-sequence quantities. However, other polarizing quantities, such as positive-sequence currents could be used.

The quantities SX1_ABP and SX2_ABP may be combined (using phase comparator, or the like) to yield an A-phase-to-B-phase adaptive reactance element. Equations 4-5 may be adapted to calculate adaptive phase-to-phase reactance elements for other phases (e.g., 8-phase-to-C-phase, C-phase-to-A-phase, and so on).

As depicted in FIG. 2A, the resistive coverage of the quadrilateral characteristic 200 may be defined by resistance blinders 240 and 241 along the resistance axis 204 (right resistance blinder Rright 240 and left resistance blinder Rleft 241). The right resistance blinder Rright 240 may be defined (in part) by a resistance setting Rset 222, which may be derived from power system properties, such as line resistance and the like and/or may be selected according to testing and/or experience.

Figure 2C:
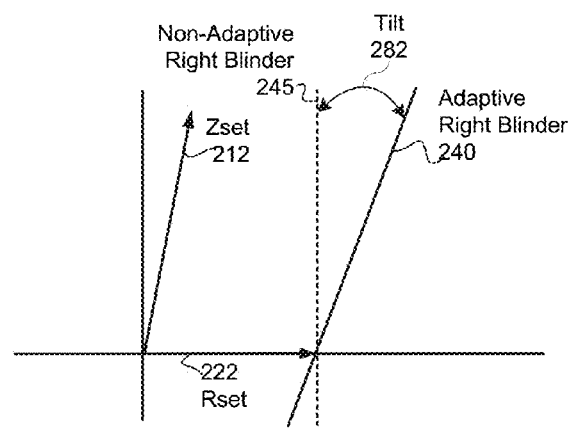
FIG. 2C illustrates an example of an adaptive resistance blinder.
Figure 2D:
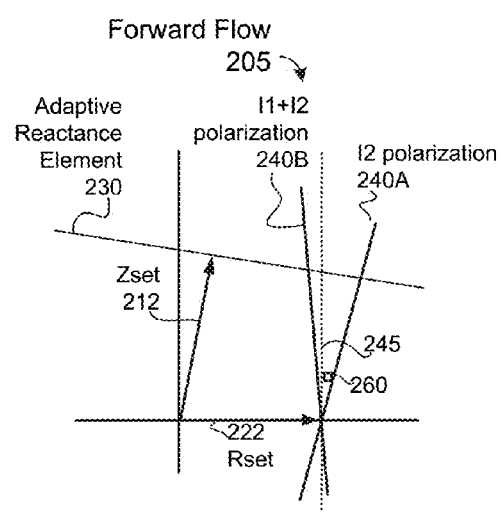
FIG. 2D illustrates an example of an adaptive reactance element and adaptive resistance blinders under forward load flow conditions.
Figure 2E:
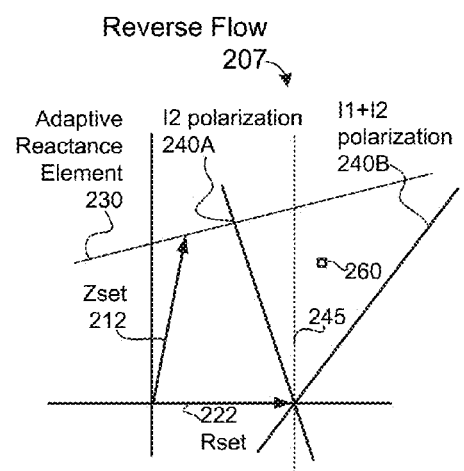
FIG. 2E illustrates an example of an adaptive reactance element and adaptive resistance blinders under reverse load flow conditions.

The resistance blinders 240 and/or 241 may be static or adaptive. In the FIG. 2A example, the right resistance blinder Rright 240 may be adaptive to accommodate and detect as much Rf as possible. As depicted in FIGS. 2C-E, the adaptive tilt 282 of the resistance blinder 240 may accommodate faults with significant fault resistance Rf and/or forward and/or reverse load flow conditions (as opposed to the non-adaptive (fixed) right blinder 245, which exhibits no tilt).

Under forward load flow conditions, polarization of Rright 240 using a negative-sequence current may provide increased resistive coverage; whereas, under reverse load flow conditions, other types of polarization (e.g., I1+I2 polarization) may provide superior resistance coverage.

FIG. 2D depicts an adaptive reactance element 230, an adaptive resistance blinder with negative-sequence polarization 240A, and an adaptive resistance blinder with I1+I2 polarization 240B for a fault occurring during a forward load flow condition 205. As shown in FIG. 2D, the adaptive blinder with negative-sequence polarization 240A provides additional Rf coverage (e.g., right tilt) to accommodate high Rf faults. Accordingly, the fault impedance (denoted as impedance 260) falls within the resistance blinder 240A. Conversely, the adaptive blinder with I1+I2 polarization 240B reduces resistive coverage (e.g., is tilted to the left, providing less coverage than the static blinder 245). As shown in FIG. 2D, the fault impedance 260 does not fall within the resistive coverage of either the adaptive resistance blinder with I1+I2 polarization 240B or the static blinder 245.

The converse may occur when the load flow direction is reversed. FIG. 2E depicts the adaptive reactance element 230, the adaptive resistance blinder with negative-sequence polarization 240A, and the adaptive resistance blinder with I1+I2 polarization 240B for a fault occurring during a reverse load flow condition 207. As shown in FIG. 2E, the adaptive blinder with I1+I2 polarization 240B provides the desired resistance coverage (e.g., right tilt) to accommodate the fault resistance Rf; the fault impedance 260 falls within the resistance blinder 240B. Conversely, the adaptive resistance blinder with negative-sequence polarization 240A is tilted to the left, reducing resistive coverage. As shown in FIG. 2E, the fault impedance 260 does not fall within the resistive coverage of either the adaptive resistance blinder with negative-sequence polarization 240A or the static blinder 245.

In some embodiments, the resistance module (e.g., module 140 of FIG. 1) may be configured to generate a plurality of adaptive resistance blinders 240 in parallel (for both phase-to-ground and/or phase-to-phase modules). The adaptive resistance blinders may include adaptive resistance blinders with polarizing quantities that provide increased resistive coverage during forward load flow conditions, and additional adaptive resistance blinders with polarizing quantities that provide increased resistive coverage during reverse load flow conditions.

Moreover, and like the adaptive reactance elements described above, the resistance module 140 may be configured to generate (in parallel) resistance blinders for phase-to-ground quadrilateral distance modules (phase-to-ground adaptive resistance blinders) and resistance blinders for phase-to-phase quadrilateral distance modules (phase-to-phase adaptive resistance blinders).

Adaptive resistance blinders may be calculated on a per-phase basis; the resistance blinders may include, but are not limited to: A-phase-to-ground adaptive resistance blinders (with increased Rf coverage for forward and reverse load flows), B-phase-to-ground adaptive resistance blinders (with increased Rf coverage for forward and reverse load flows), C-phase-to-ground adaptive resistance blinders (with increased Rf coverage for forward and reverse load flows), A-phase-to-B-phase adaptive resistance blinders (with increased Rf coverage for forward and reverse load flows), B-phase-to-C-phase adaptive resistance blinders (with increased Rf coverage for forward and reverse load flows), C-phase-to-A-phase adaptive resistance blinders (with increased Rf coverage for forward and reverse load flows), and so on. The adaptive resistance blinders may be calculated using respective operating and polarizing quantities, which may be combined using phase comparators, or the like as described above.

The operating quantity for an A-phase-to-ground adaptive resistance blinder (SR1_AG) may be calculated per Equation 6:

$$SR1\_AG = VA - RsetG \cdot (IA + k0 \cdot 3I0) \qquad \text{Eq. 6}$$

In Equation 6, VA is an A-phase voltage, IA may correspond to an A-phase current, k0 may be a zero-sequence compensating factor, and I0 may correspond to a zero-sequence current.

The polarizing quantity to provide increased Rf coverage for forward load flow conditions (e.g., a forward adaptive resistance blinder, or phase-to-ground forward adaptive resistance blinder) may be calculated per Equation 7:

$$SR2\_AGF = IA2 \cdot e^{j\theta L1} \qquad \text{Eq. 7}$$

Equation 7 calculates the polarizing quantity for the A-phase-to-ground adaptive resistance blinder with improved Rf coverage for forward load flow conditions, which is denoted SR2_AGF. IA2 is an A-phase negative-sequence current, and $\theta L1$ is the angle of the positive-sequence line impedance. Although the polarizing quantity SR2_AGF of Equation 7 uses negative-sequence current, in other embodiments, other polarizing quantities (adapted for providing improved Rf coverage for forward load flow conditions) could be used, such as a zero-sequence current, or the like (e.g., SR2_AGF=IA0·$e^{j\theta L1}$).

Equation 7 may be adapted to calculate phase-to-ground adaptive resistance blinders with improved Rf coverage for forward load flow conditions for other phases (e.g., B-phase, C-phase, and so on).

As described above, a separate resistance blinder may be provided that is adapted to provide improved Rf coverage for reverse load flow conditions. Equation 8 calculates a polarizing quantity for providing improved Rf coverage for reverse load flow conditions (e.g., a reverse adaptive resistance blinder, or phase-to-ground reverse adaptive resistance blinder). As shown in Equation 8, the reverse load flow polarization quantity (SR2_AGR) uses different sequence components than the polarization quantity of Equation 7:

$$SR2\_AGR = (IA1 + IA2)e^{j\theta L1} \qquad \text{Eq. 8}$$

Equation 8 calculates the polarizing quantity for the A-phase-to-ground adaptive resistance blinder with improved Rf coverage for reverse load flow conditions, which is denoted SR2_AGR. The polarizing quantity is derived from a sum of a positive- and negative-sequence components (e.g., IA1-IA2). In alternative embodiments, Equation 8 may use different polarizing quantities, such as a sum of zero- and positive-sequence components, or the like (e.g., SR2_AGR=(IA0+IA1) $e^{j\theta L1}$).

As would be recognized by one of skill in the art, Equations 6-8, and/or variations thereof, could be adapted to calculate phase-to-ground adaptive resistance blinders for the B- and/or C-phases (e.g., SR1_BG, SR2_BGF, SR2_BGR, SR1_CG, SR2_CGF, SR2_CFR, and so on).

The operating and polarizing quantities SR1 and SR2 of Equations 6-8 may be combined to calculate an adaptive resistance blinder (e.g., the adaptive resistance blinders 240 described above). The combination may be implemented using various techniques, such as a phase comparator (e.g., a 90° phase comparator as depicted in FIGS. 3C and 3D), or the like.

In a phase comparator approach, a phase-to-ground adaptive resistance blinder with improved Rf coverage for forward load flow conditions (represented as RAG2 to denote the A-phase-to-ground adaptive resistance blinder with negative-sequence polarization) may be calculated per Equation 9 below:

$$RAG2 = \frac{Im[VA \cdot (IA2 \cdot e^{j\theta L1})^*]}{Im[(IA + k0 \cdot 3 \cdot I0) \cdot (IA2 \cdot e^{j\theta L1})^*]} \qquad \text{Eq. 9}$$

As discussed above, in alternative embodiments, Equation 9 may be adapted to use different types of sequential components (e.g., zero-sequence, or the like).

A phase-to-ground adaptive resistance blinder with improved Rf coverage for reverse load flow conditions may be calculated per Equation 10 (represented as RAGI2 to denote the A-phase-to-ground adaptive resistance blinder with I1+I2 polarization)

$$RAGI2 = \frac{Im[VA \cdot ((IA1 + IA2) \cdot e^{j\theta L1})^*]}{Im[(IA + k0 \cdot 3 \cdot I0) \cdot ((IA1 + IA2) \cdot e^{j\theta L1})^*]} \quad \text{Eq. 10}$$

As discussed above, in alternative embodiments, Equation 10 may be adapted to use different types of sequential components (e.g., sum of zero- and positive-sequential components, or the like).

As would be appreciated by one of skill in the art, other variations to Equations 9 and/or 10 could be used to calculate an adaptive resistance blinders with improved Rf coverage for forward and/or reverse load flow conditions for other phases (e.g., B-phase, C-phase, etc.), and so on.

An operating quantity for an adaptive phase-to-phase resistance blinder may be calculated per Equation 11 below:

$$SR1\_ABP=(VA-VB)-RsetP(IA-IB) \quad \text{Eq. 11}$$

Equation 11 calculates an operating quantity for an A-phase-to-B-phase adaptive resistance blinder, denoted as SR1_ABP. VA represents an A-phase voltage measurement, VB represents a B-phase voltage measurement, IA is an A-phase current measurement, and IB is a B-phase current measurement. RsetP refers to a resistance setting that, as described above, may be derived from properties of the electrical power system and set by testing and/or experience. Equation 11 may be adapted to calculate operating quantities for other phase-to-phase, adaptive resistance blinders (e.g., SR1_BCP, SR1_CAP, and so on).

The operating quantity of Equation 11 may be used with a polarizing quantity calculated per Equation 12 to provide improved Rf coverage for forward load flow conditions:

$$SR2\_ABPF=(IA2-IB2)\cdot e^{j\theta L1} \quad \text{Eq. 12}$$

Equation 12 calculates a polarizing quantity for a forward A-phase-to-B-phase adaptive resistance blinder that provides improved Rf coverage for forward load flow conditions (denoted SR2_ABPF). IA2 is an A-phase negative-sequence current and IB2 is a B-phase negative-sequence current. As described above, Equation 12 adapts the polarizing quantity SR2_ABPF to improve Rf coverage for forward load flow conditions using negative-sequence currents. However, in alternative embodiments, other polarizing quantities to improve Rf coverage for forward load flow conditions may be used.

A polarizing quantity (adapted to improve Rf coverage for reverse load flow conditions) may be calculated per Equation 13:

$$SR2\_ABPR=(IA1-IB1)\cdot e^{j\theta L1} \quad \text{Eq. 13}$$

Equation 13 calculates a polarizing quantity for an A-phase-to-B-phase adaptive resistance blinder that provides improved Rf coverage for reverse load flow conditions (denoted SR2_ABPR). Equation 13 adapts the polarizing quantity SR2_ABPR for reverse load flow conditions using positive-sequence components. However, in alternative embodiments, other polarizing quantities to improve Rf coverage for reverse load flow conditions may be used.

The operating and polarizing quantities of Equations 11 and 12 and/or 13 may be combined to form an adaptive phase resistance blinder; the combination may be implemented using a phase comparator (e.g., a 90° phase comparator as depicted in FIGS. 3C and 3D), or the like, as described above. The phase-to-phase adaptive resistance blinders (with improved Rf coverage for forward and reverse load flow conditions) may be calculated on a per-phase basis. The equations for calculating A-phase-to-B-phase operating and/or polarizing quantities described above (Equations 11-13) may be adapted for other phase-to-phase modules (e.g., B-phase-to-C-phase, C-phase-to-A-phase, and so on).

Referring to FIG. 2A, the left resistance blinder (Rleft) 241, may be configured to limit the operation of the quadrilateral distance module for reverse load flow. Accordingly, Rleft 241 may not be adaptive. Rleft 241 may be configured to include small values of resistance (e.g., to ensure satisfactory operation for very reactive lines). However, in alternative embodiments, Rleft 241 may be implemented as an adaptive blinder (e.g., using operating and polarizing quantities as described above). In some embodiments, the left resistance blinder 241 may be calculated using operating and polarizing quantities SRL1 and SRL2, respectively. The operating quantity for a left resistance blinder of an A-phase-to-ground quadrilateral distance module (SRL1_AG) may be calculated per Equation 14:

$$SRL1\_AG=VA+RleftG(IA+k0\cdot 3\cdot I0) \quad \text{Eq. 14}$$

In Equation 14, VA is an A-phase voltage measurement, RleftG is a constant (derived from power system properties and set according to testing and/or experience), IA is an A-phase current, and I0 is a zero-sequence current.

The polarizing quantity for a left resistance blinder of an A-phase-to-ground quadrilateral distance module (SRL2_AG) may be calculated per Equation 15:

$$SRL2\_AG=IA+k0\cdot 3\cdot I0 \quad \text{Eq. 15}$$

The operating and polarizing values SRL1_AG and SRL2_AG may be combined as described above (e.g., using a phase comparator, or the like). Equations 14 and 15 may be adapted to calculate phase-to-ground left resistance blinders for other phases (e.g., B-phase-to-ground, C-phase-to-ground, and so on).

The operating value for a left resistance blinder RleftP 241 for a phase-to-phase quadrilateral distance module may be calculated in a similar manner. An operating quantity for an A-phase-to-B-phase quadrilateral distance module (SRL1_ABP) may be calculated per Equation 16:

$$SRL1\_ABP=(VA-VB)+RLeftP(IA-IB) \quad \text{Eq. 16}$$

The polarizing quantity for an A-phase-to-B-phase quadrilateral distance module (SRL2_ABP) may be calculated per Equation 17:

$$SRL2\_ABP=IA-IB \quad \text{Eq. 17}$$

The operating and polarizing values SRL1_ABP and SRL2_ABP may be combined as described above (e.g., using a phase comparator, or the like). Equations 16 and 17 may be adapted to calculate phase-to-phase left resistance blinders for other phases (e.g., B-phase-to-C-phase, C-phase-to-A-phase, and so on).

A directional module (e.g., directional module 150 of FIG. 1) may be configured to determine the direction of a fault and/or configure the quadrilateral distance module to detect faults occurring in the forward direction only. Fault direction (denoted T32Q below) may be determined according to Equation 18:

$$T32Q=|3\cdot V2|\cdot|3\cdot I2|\cdot \cos[\angle 3\cdot V2-(\angle 3\cdot I2+\angle Z_{L1})] \quad \text{Eq. 18}$$

Alternatively, the directional element of Equation 18 may be implemented using other symmetrical components, such as zero-sequence components or the like.

The adaptive reactance elements and adaptive resistance blinders described above may be used to implement a quadrilateral distance module (e.g., module 120 of FIG. 1). FIG. 3A is a functional block diagram depicting a quadrilateral distance module 320 implemented within and/or in conjunction with an IED 310.

The quadrilateral distance module 320 receives stimulus 322 from an electrical power system (not shown), such as the power system 100 of FIG. 1. The stimulus 322 may include current phasor measurements, voltage phasor measurements, and the like. The stimulus 322 may comprise measurements of each phase of a three-phase system (e.g. A-phase, B-phase, and/or C-phase current and/or voltage measurements).

The quadrilateral distance module 320 may comprise phase-to-ground quadrilateral distance modules(s) 324 and phase-to-phase quadrilateral distance module(s) 326. The phase-to-ground module(s) 324 and/or the phase-to-phase module(s) 326 may comprise adaptive reactance elements calculated using Equation 2 and Equations 1-5 (and/or variations thereof) and adaptive resistance blinders calculated using Equations 6-13 (and/or variations thereof). The modules 324 and/or 326 may further comprise left resistance blinders and/or directional modules implementing Equations 14-18 above.

The phase-to-ground quadrilateral distance module(s) 324 may comprise phase-to-ground modules for each phase of a three-phase system (e.g., A-phase-to-ground, B-phase-to-ground, C-phase-to-ground, and so on). Outputs of the separate, parallel modules 324 may be combined (using OR logic or the like, not shown) into an output 325. The output 325 may assert if any one of the phase-to-ground module(s) 324 detects a fault condition.

The phase-to-phase quadrilateral distance module(s) 326 may comprise a phase-to-phase module for each phase of a three-phase system (e.g., A-phase-to-B-phase, B-phase-to-C-phase, C-phase-to-A-phase, and so on). Outputs of the separate, parallel modules 326 may be combined (using OR logic or the like, not shown) into an output 327. The output 327 may assert if any one of the phase-to-phase module(s) 326 detects a fault condition.

The outputs 325 and 327 of the phase-to-ground quadrilateral distance module(s) 324 and the phase-to-phase quadrilateral distance module(s) 326 may be combined (using OR logic 328) into the quadrilateral distance module output 329.

FIG. 3B is a functional block diagram depicting a quadrilateral distance module 320 implemented within and/or in conjunction with an IED 310. The adaptive resistance blinders described above may be adapted to have improved Rf coverage for forward and/or reverse load flow conditions. In the FIG. 3B example, the quadrilateral distance module 320 comprises parallel phase-to-ground quadrilateral distance modules 324A and 324B; the module(s) 324A may include resistance blinders with improved Rf coverage for forward load flow conditions (e.g., implemented using negative-sequence polarization, or the like), and the module(s) 324B may include resistance blinders with improved Rf coverage for reverse load flow conditions (e.g., implementing I1+I2 polarization, or the like). The module 320 may further comprise parallel phase-to-phase quadrilateral distance module(s) 326A and 326B; the module(s) 326A may include resistance blinders with improved Rf coverage for forward load flow conditions (e.g., implementing negative-sequence polarization, or the like), and the module(s) 326B may include resistance blinders with improved Rf coverage for reverse load flow conditions (e.g., implementing positive-sequence polarization, or the like). The outputs of the parallel modules 324A and 324B and 326A and 326B may be combined (using OR logic or the like), to generate the outputs 325 and 327.

FIG. 3C is a functional block diagram of one embodiment of a phase-to-ground quadrilateral distance module(s) 324. As shown in FIG. 3C, the phase-to-ground quadrilateral distance module(s) 324 may be implemented as a set of separate logic modules for each phase (Quad_AG, Quad_BG, Quad_CG, and so on) and/or may be implemented using a single module (and/or set of logic modules) (not shown).

Although FIG. 3C depicts the implementation details for a single phase-to-ground module (A-phase-to-ground), other phase-to-ground modules (Quad_BG and/or Quad_CG) could be implemented using similar components (e.g., comparators 360, 362, 364, and/or 366), and/or directional module 368.

The 90° phase comparator 360 may implement a phase-to-ground adaptive reactance element (using power system stimulus 322). Accordingly, the comparator 360 may compare an adaptive reactance A-phase-to-ground operating quantity SX1_AG (e.g., calculated per Equation 1, or a variant thereof), with a polarizing quantity SX2_AG (e.g., calculated per Equation 3, or a variation thereof). The polarizing quantity may be selected according to a polarization selection signal (XPOL). If negative-sequence polarization is to be used (as indicated by XPOL), SX2_AG may use negative-sequence stimulus components (e.g. negative-sequence currents as shown in Equation 3), alternatively, SX2_AG may be calculated using a zero-sequence current. An output of the comparator 360 may flow to AND logic 370 (or an equivalent) to be combined with the outputs of the other comparators 362, 364, 366, and/or the directional module 368. The output of the comparator 360 may assert when the stimulus 322 satisfies the adaptive reactance element of the comparator 360.

The 90° phase comparator 362 may implement an A-phase-to-ground adaptive resistance blinder with improved Rf coverage for forward load flow conditions. Accordingly, the comparator 362 may compare an A-phase-to-ground adaptive resistance operating quantity SR1_ AG (e.g., calculated per Equation 6, or a variant thereof) with an A-phase-to-ground adaptive polarizing quantity that provides improved Rf coverage for forward load flow conditions SR2_AGF (e.g., calculated per Equation 7, or a variant thereof). The polarizing quantity may be selected according to XPOL. If negative-sequence polarization is used (as indicated by XPOL), SR2_AGF may be calculated per Equation 7; otherwise a variant (using zero-sequence components) may be used. The output of the comparator 362 may assert when the stimulus 322 satisfies the forward A-phase-to-ground adaptive resistance blinder of comparator 362.

The 90° phase comparator 364 may implement an A-phase-to-ground adaptive resistance blinder with improved Rf coverage for reverse load flow conditions. Accordingly, the comparator 364 may compare the A-phase-to-ground adaptive resistance operating quantity SR1_AG (e.g., calculated per Equation 6, or a variation thereof) with an A-phase-to-ground adaptive polarizing quantity that provides improved Rf coverage for reverse load flow conditions SR2_AGR (e.g., calculated per Equation 8, or a variant thereof). SR2_AGR may be derived from a sum of positive- and negative-sequential components and/or a sum of positive- and zero-sequential components (e.g., as indicated by XPOL). The output of the comparator 364 may assert when the stimulus 322 satisfies the reverse A-phase-to-ground adaptive resistance blinder of comparator 364.

Outputs of the 90° phase comparators 362 and 364 may be combined using OR logic 363 (or an equivalent). Accordingly, the module 324 may be configured to detect high Rf faults occurring under either forward load flow or reverse load flow conditions (in parallel).

The 90° phase comparator 366 may implement an A-phase-to-ground left resistance blinder (e.g., Rleft 241). Accordingly, the comparator 366 may compare an A-phase-to-ground left resistance operating quantity SRL1_AG (e.g., calculated per Equation 14, or a variant thereof), with an A-phase-to-ground left resistance polarizing quantity SRL2_AG (e.g., calculated per Equation 15, or variant thereof). The output of the comparator 366 may assert when the stimulus 322 satisfies the left resistance blinder of comparator 366.

In some embodiments, the module 324 may include a directional module 368 to determine fault direction using negative-sequence quantities (e.g., per Equation 18). The directional module 368 may be configured to cause the module 324 to only detect faults occurring in the forward direction, and to suppress operation for faults occurring behind IED 110.

The outputs of the comparators 360, 362, 364, and 366, and the directional module 368 may be combined by AND logic 370 (or an equivalent), the output of which may comprise an A-phase-to-ground quadrilateral distance module output (Quad_AG). The Quad_AG output may be combined with a B-phase-to-ground quadrilateral distance module output (Quad_BG) and a C-phase-to-ground quadrilateral distance module output (Quad_CG) using OR logic 372 (or an equivalent) to form the phase-to-ground quadrilateral distance module output 325.

FIG. 3D is a functional block diagram of one embodiment of a phase-to-phase quadrilateral distance module 326. As shown in FIG. 3D, the phase-to-phase quadrilateral distance module(s) 326 may be implemented as a set of separate logic modules for each phase (Quad_AB, Quad_BC, Quad_CA, and so on) and/or may be implemented using a single module (and/or set of logic) (not shown).

Although FIG. 3D depicts implementation details for an A-phase-to-B-phase quadrilateral distance module, other phase-to-phase modules (Quad_BC and/or Quad_CA) could be implemented by adapting the A-phase-to-B-phase modules depicted in FIG. 3D (e.g., comparators 380, 382, 384, and/or 386), and/or directional module 388.

The 90° phase comparator 380 may implement a phase-to-phase adaptive reactance element (using the stimulus 322 obtained from the electrical power system). Accordingly, the comparator 380 may compare an adaptive reactance A-phase-to-B-phase operating quantity SX1_ABP (e.g., calculated per Equation 4, or a variant thereof), with a corresponding polarizing quantity SX2_ABP (e.g., calculated per Equation 5, or a variant thereof). The output of the comparator 380 may assert when the stimulus 322 satisfies the adaptive reactance element of comparator 380.

The output of the comparator 380 may flow to AND logic 390 (or an equivalent) to be combined with the outputs of the other comparators 382, 384, 386, and/or the directional module 388.

The 90° phase comparator 382 may implement an A-phase-to-B-phase adaptive resistance blinder with improved Rf coverage for forward load flow conditions. Accordingly, the comparator 382 may compare an A-phase-to-B-phase adaptive resistance operating quantity SR1_ABP (e.g., calculated per Equation 11, or a variant thereof) with an A-phase-to-B-phase polarizing quantity with improved Rf coverage for forward load flow conditions SR2_ABPF (e.g., calculated per Equation 12 using negative-sequence components, or a variant thereof). The output of the comparator 382 may assert when the stimulus 322 satisfies the adaptive resistance blinder with improved Rf coverage for forward load flow conditions of comparator 382.

The 90° phase comparator 384 may implement an A-phase-to-B-phase adaptive resistance blinder with improved Rf coverage for reverse load flow conditions. Accordingly, the comparator 384 may compare the A-phase-to-B-phase adaptive resistance operating quantity SR1_ABP (e.g., calculated per Equation 11, or a variant thereof) with an A-phase-to-B-phase polarizing quantity that provides improved Rf coverage for reverse load flow conditions SR2_ABPR (e.g., calculated per Equation 13, using positive-sequence components, or a variant thereof). The output of the comparator 384 may assert when the stimulus 322 satisfies the adaptive resistance blinder with improved Rf coverage for reverse load flow conditions of comparator 384.

Outputs of the 90° phase comparators 382 and 384 may be combined using OR logic 383 (or an equivalent). Accordingly, the module 326 may be configured to detect high Rf faults occurring in either forward load flow or reverse load flow conditions (in parallel).

The 90° phase comparator 386 may implement an A-phase-to-B-phase left resistance blinder. Accordingly, the comparator 386 may compare an A-phase-to-B-phase left resistance operating quantity SRL1_ABP (e.g., calculated per Equation 16, or a variant thereof), with an A-phase-to-B-phase left resistance polarizing quantity SRL2_ABP (e.g., calculated per Equation 17, or a variant thereof). The output of the comparator 386 may assert when the stimulus 322 satisfies the left resistance blinder of comparator 386.

In some embodiments, the module 326 may comprise a directional module 388 to determine the fault direction using negative-sequence measurements (e.g., per Equation 18 above). The directional module 388 may be configured to cause the module 326 to only detect faults occurring in the forward direction and to suppress operation for faults occurring behind IED 110.

The outputs of the comparators 380, 382, 384, and 386, and the directional module 388 may be combined by AND logic 390 (or an equivalent), the output of which may comprise an A-phase-to-B-phase quadrilateral distance module output (Quad_AB). The Quad_AB output may be combined with a B-phase-to-C-phase quadrilateral distance module output (Quad_BC) and a C-phase-to-A-phase quadrilateral distance module output (Quad_CA) using OR logic 392 (or an equivalent) to form the phase-to-phase quadrilateral distance module output 327.

Figure 4:
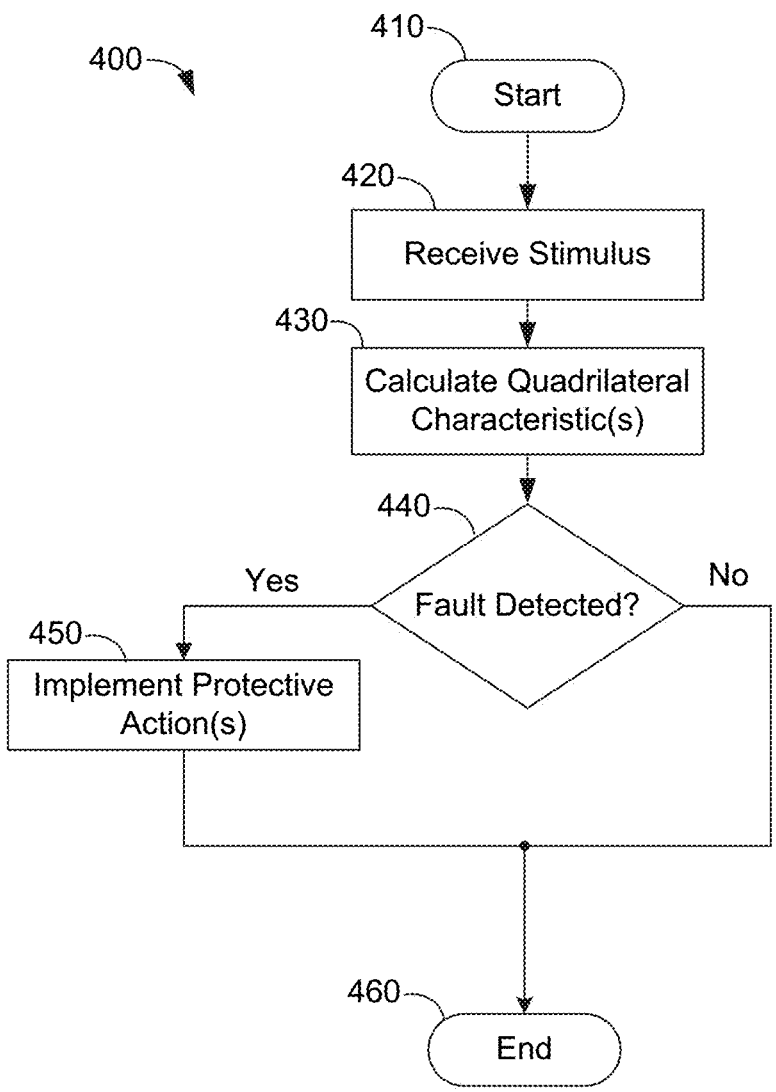
FIG. 4 illustrates a flow diagram of one embodiment of a method for protecting an electrical power system using a quadrilateral distance module comprising an adaptive resistance blinder.

FIG. 4 is a flow diagram of one embodiment of a method 400 for protecting and/or monitoring an electrical power system using an adaptive quadrilateral characteristic comprising an adaptive resistance blinder. At step 410, the method 400 may start and be initialized. Step 410 may comprise loading one or more machine-readable instructions from a storage medium, initializing machine resources, and the like.

At step 420, stimulus from the electrical power system may be received. The stimulus may comprise current and/or voltage measurements obtained from the electrical power system using one or more measurement devices, such as current transformers, voltage measurement devices, or the like. The stimulus inputs of step 420 may comprise phasor measurements, measurements of each phase of a three-phase signal, or the like.

At step 430, the stimulus may be used to generate an adaptive quadrilateral characteristic. Accordingly, step 430 may comprise calculating phase-to-ground adaptive reactance elements and/or phase-to-phase adaptive reactance elements. The quadrilateral characteristics(s) calculated at step 430 may include an adaptive resistance blinder. Accordingly, step 430 may comprise calculating one or more adaptive phase-to-ground and/or phase-to-phase resistance blinders. Step 430 may further comprise calculating one or more adaptive resistance blinders with improved Rf coverage for forward load flow conditions in parallel with one or more adaptive resistance blinders with improved Rf coverage for reverse load flow conditions. Outputs of quadrilateral distance modules comprising the adaptive resistance blinders with improved Rf coverage for forward and/or reverse load flow conditions may be combined in an OR operation (or logical equivalent) as depicted in FIGS. 3C and 3D.

Also in step 430, the method 400 may determine if a fault has occurred using the quadrilateral characteristic(s) comprising respective adaptive resistance blinders. Step 430 may comprise implementing one or more comparators (e.g., 90° phase comparators of FIGS. 3C and 3D). Step 430 may further comprise evaluating one or more directional modules (directional module 368 and/or directional module 388) and to suppress operation if the directional module(s) indicate that the fault did not occur in a forward direction with respect to the method 400.

If at step 440, a fault is detected (one or more of the phase-to-ground and/or phase-to-phase quadrilateral distance modules detects a fault condition), the flow may continue to step 450; otherwise, the flow may continue to step 460.

At step 450, the method 400 may implement one or more protective and/or monitoring functions which may include, but are not limited to: tripping one or more breakers, operating one or more switches, asserting one or more alarms, issuing one or more notifications, or the like.

At step 460, the method 400 may terminate until a next set of stimulus is received, at which point the flow may continue at step 420.

Figure 5:
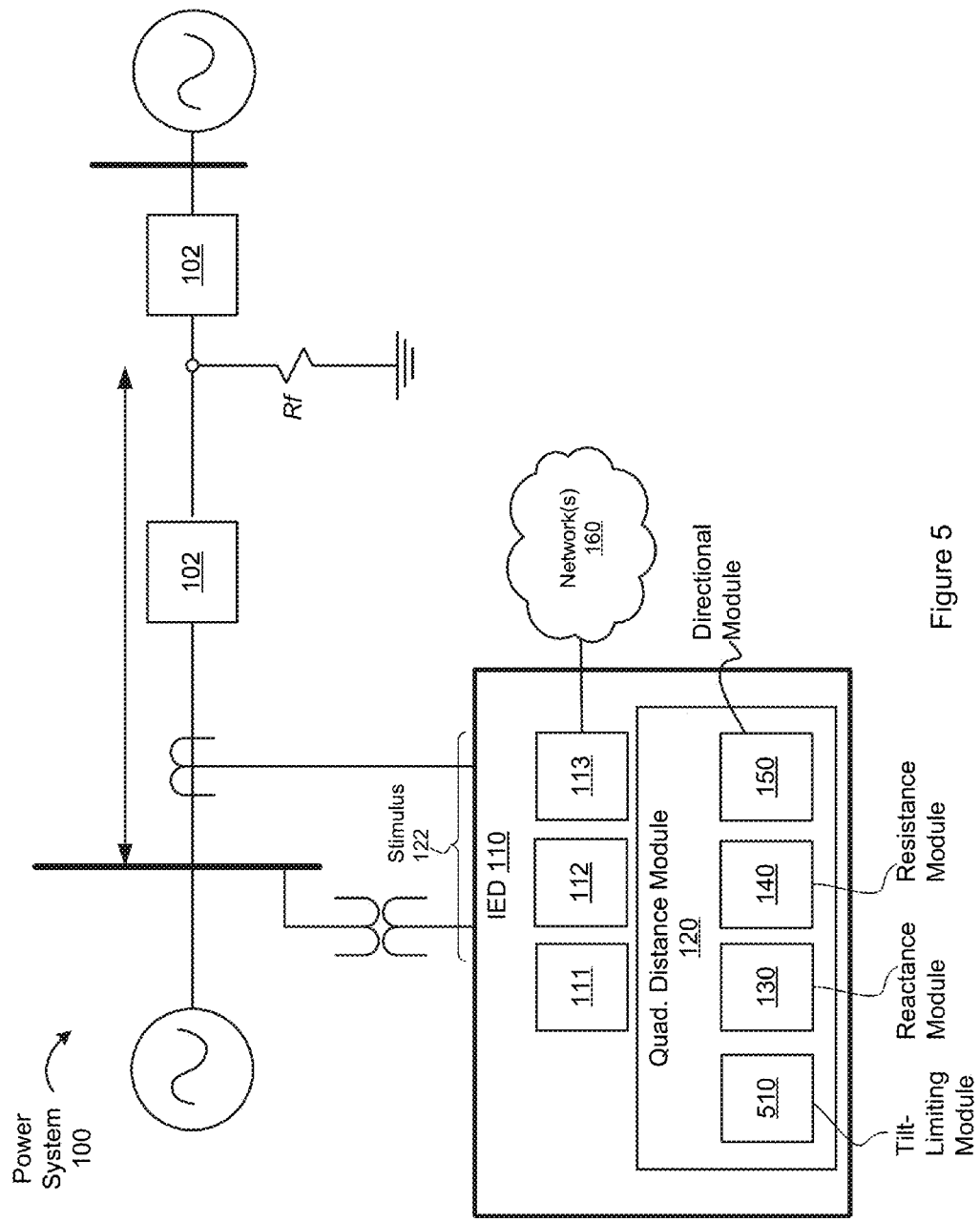
FIG. 5 illustrates an electrical power system comprising an IED implementing a quadrilateral distance module and a tilt-limiting module.

In certain circumstances, an adaptive reactance element and/or an adaptive resistance blinder may result in reactance element and blinder tilts that may not be as secure as necessary for an application of a quadrilateral distance element. Thus, an IED implementing a quadrilateral distance module may further include a tilt-limiting module configured to limit the amount of tilt of the reactance element and/or the resistance blinders. FIG. 5 illustrates one embodiment of an electric power system similar to that illustrated in FIG. 1, wherein the IED 110 also includes a tilt-limiting module 510. The tilt-limiting module is configured to accept user-defined predetermined angle inputs and limit the tilt of the reactance element and/or the resistance blinders in accordance with the description herein. In one embodiment, the tilt-limiting module limits the tilt of the reactance element and/or the resistance blinders by selecting the polarizing quantity used in the reactance elements and/or the resistance blinders depending upon the operating conditions.

The tilt-limiting module may be set by a user with predetermined angles. In some embodiments, the tilt-limiting module may be pre-set at the factory with predetermined angles. Different predetermined angles may be used for each quadrilateral distance calculation. The tilt-limiting module may calculate absolute value of an angle between a current polarizing quantity and an element loop current, and compare that difference with the predetermined angle. If the absolute value of the angle difference does not exceed the predetermined angle conditions, then the tilt-limiting module may use the sequence component based current polarizing quantity (e.g. negative-sequence, positive-sequence, combination of positive- and negative-sequence, combination of positive- and zero-sequence, etc.) to polarize the adaptive reactance element and/or resistance blinders. If, however, the absolute value of the angle difference is greater than the predetermined angle, then the element loop current may be used to polarize the adaptive reactance element and/or resistance blinders. The predetermined angle, current polarizing quantity, and element loop current may be different for each of the various reactance elements and resistance blinders. The predetermined angles may be pre-set. In one specific embodiment, the predetermined threshold angles may be set as:

| Predetermined Angle | Default Value |
|---|---|
| Phase Quadrilateral Reactance Element | 65° |
| Phase Quadrilateral Positive-Sequence Resistance Blinders | 30° |
| Phase Quadrilateral Negative-Sequence Resistance Blinders | 30° |
| Ground Quadrilateral Reactance Element | 65° |
| Ground Quadrilateral Composite Resistance Blinders (zero-sequence and negative-sequence) | 30° |
| Ground Quadrilateral Resistance Blinders | 30° |

The following element loop currents may be used in a phase quadrilateral reactance element according to several embodiments:

$$IA\_LOOP = IA + k0 \cdot (3 \cdot I0)$$

$$IB\_LOOP = IB + k0 \cdot (3 \cdot I0)$$

$$IC\_LOOP = IC + k0 \cdot (3 \cdot I0)$$

$$IAB\_LOOP = IA - IB$$

$$IBC\_LOOP = IB - IC$$

$$ICA\_LOOP = IC - IA$$

where:
IA_LOOP is the phase loop current quantity for the A phase loop;
IB_LOOP is the phase loop current quantity for the B phase loop;
IC_LOOP is the phase loop current quantity for the C phase loop;
IAB_LOOP is the phase loop current quantity for the A-to-B phase loop;
IBC_LOOP is the phase loop current quantity for the B-to-C phase loop;
ICA_LOOP is the phase loop current quantity for the C-to-A phase loop;
k0 is a constant;
IA is the A-phase current;
IB is the A-phase current;
IC is the A-phase current; and,
I0 is the zero-sequence current.

For a phase quadrilateral reactance element, the current polarizing quantity may be a negative-sequence current or a corresponding phase-to-phase loop current. The polarizing conditions for a phase quadrilateral reactance element for AB, BC, and CA phases may be polarized with the corresponding negative-sequence current polarization quantity when the absolute value of an angle between the negative-sequence current polarizing quantity and the corresponding phase loop current does not exceed a predetermined threshold, and self-polarized with the corresponding phase loop currents otherwise:

| Phases | I2 polarized reactance element |
|---|---|
| AB | Negative-Sequence AB Phase Polarization (3IAB2): If the angle between 3IAB2 and the AB phase loop current (IAB_LOOP) does not exceed the predetermined angle threshold; and OTHERWISE: IAB_LOOP |
| BC | Negative-Sequence BC Phase Polarization (3IBC2): If the angle between 3IBC2 and the BC phase loop current (IBC_LOOP) does not exceed the predetermined angle threshold; and OTHERWISE: IBC_LOOP |
| CA | Negative-Sequence CA Phase Polarization (3ICA2): If the angle between 3ICA2 and the CA phase loop current (ICA_LOOP) does not exceed the predetermined angle threshold; and OTHERWISE: ICA_LOOP |

For phase quadrilateral positive-sequence resistance blinder, the current polarizing quantity may be a positive-sequence current or a corresponding element loop current. The quadrilateral resistance positive-sequence blinder for AB, BC, and CA phase elements may be polarized with the corresponding positive-sequence current polarization quantity when the absolute value of an angle between the positive-sequence current polarizing quantity and the corresponding phase loop current does not exceed a predetermined threshold, and self-polarized with the corresponding phase loop currents otherwise:

| Phases | I1 polarized right resistance blinder |
|---|---|
| AB | Positive-Sequence AB Phase Polarization (IAB1): If the angle between IAB1 and the AB phase loop current (IAB_LOOP) does not exceed the predetermined angle threshold; and OTHERWISE: IAB_LOOP |
| BC | Positive-Sequence BC Phase Polarization (IBC1): If the angle between IBC1 and the BC phase loop current (IBC_LOOP) does not exceed the predetermined angle threshold; and OTHERWISE: IBC_LOOP |
| CA | Positive-Sequence CA Phase Polarization (ICA1): If the angle between ICA1 and the CA phase loop current (ICA_LOOP) does not exceed the predetermined angle threshold; and OTHERWISE: ICA_LOOP |

For phase quadrilateral negative-sequence resistance blinder, the current polarizing quantity may be a negative-sequence current or a corresponding element loop current. The polarizing conditions for a phase quadrilateral resistance negative-sequence blinder for AB, BC, and CA phase elements may be polarized with the corresponding negative-sequence current polarization quantity when the absolute value of an angle between the negative-sequence current polarizing quantity and the corresponding phase loop current does not exceed a predetermined threshold, and self-polarized with the corresponding phase loop currents otherwise:

| Phases | I2 polarized right resistance blinder |
|---|---|
| AB | Negative-Sequence AB Phase Polarization (3IAB2): If the angle between 3IAB2 and the AB loop current (IAB_LOOP) does not exceed the predetermined angle threshold; and OTHERWISE: IAB_LOOP |
| BC | Negative-Sequence BC Phase Polarization (3IBC2): If the angle between 3IBC2 and the BC loop current (IBC_LOOP) does not exceed the predetermined angle threshold; and OTHERWISE: BC Loop Current Polarization (IBC_LOOP) |
| CA | Negative-Sequence CA Phase Polarization (3ICA2): If the angle between 3ICA2 and the CA loop current (ICA_LOOP) does not exceed the predetermined angle threshold; and OTHERWISE: CA Loop Current Polarization (ICA_LOOP) |

For ground quadrilateral zero-sequence reactance element, the current polarizing quantity may be a zero-sequence current or a corresponding phase-ground loop current. The polarizing conditions for a ground quadrilateral zero-sequence reactance element for AG, BG, and CG fault conditions may be polarized with the corresponding zero-sequence current polarization quantity when an absolute value of an angle between the zero-sequence current and the corresponding phase-ground loop current does not exceed a predetermined threshold, and self-polarized with the corresponding phase-ground loop currents otherwise:

| Phases | I0 polarized reactance element |
|---|---|
| AG | Zero-Sequence Current Polarization (3I0): If the angle between 3I0 and the AG loop current IAG_LOOP does not exceed the predetermined angle threshold; and OTHERWISE: IAG_LOOP |
| BG | Zero-Sequence Current Polarization (3I0): If the angle between 3I0 and the BG loop current IBG_LOOP does not exceed the predetermined angle threshold; and OTHERWISE: IBG_LOOP |
| CG | Zero-Sequence Current Polarization (3I0): If the angle between 3I0 and the CG loop current ICG_LOOP does not exceed the predetermined angle threshold; and OTHERWISE: ICG_LOOP |

For ground quadrilateral negative-sequence reactance element, the current polarizing quantity may be a negative-sequence current or a corresponding phase-ground loop current. The polarizing conditions for a ground quadrilateral negative-sequence reactance element for AG, BG, and CG fault conditions may be polarized with the corresponding negative-sequence current polarization quantity when the absolute value of an angle between the corresponding negative-sequence current and the corresponding phase-ground loop current does not exceed a predetermined threshold, and self-polarized with the corresponding phase-ground loop currents otherwise:

| Phases | I2 polarized reactance element |
|---|---|
| AG | Negative-Sequence Current Polarization (3IA2): If the angle between 3IA2 and the AG loop current IAG_LOOP does not exceed the predetermined angle threshold; and, OTHERWISE: IAG_LOOP |
| BG | Negative-Sequence Current Polarization (3IB2): If the angle between 3IB2 and the BG loop current IBG_LOOP does not exceed the predetermined angle threshold; and OTHERWISE: IBG_LOOP |
| CG | Negative-Sequence Current Polarization (3IC2): If the angle between 3IC2 and the CG loop current ICG_LOOP does not exceed the predetermined angle threshold; and OTHERWISE: ICG_LOOP |

For ground quadrilateral zero-sequence resistance blinders, the current polarizing quantity may be a zero-sequence current or a corresponding phase-ground loop current. The polarizing conditions for a ground quadrilateral zero-sequence resistance blinders for AG, BG, and CG fault conditions may be polarized with the corresponding zero-sequence current polarization quantity when the absolute value of an angle between the zero-sequence current and the corresponding phase-ground loop current does not exceed a predetermined threshold, and self-polarized with the corresponding phase-ground loop current otherwise:

| Phases | I0 polarized right resistance blinder |
|---|---|
| AG | Zero-Sequence Current Polarization (3I0): If the angle between 3I0 and the AG loop current IAG_LOOP does not exceed the predetermined angle threshold; and, OTHERWISE: IAG_LOOP |
| BG | Zero-Sequence Current Polarization (3I0): If the angle between 3I0 and the BG loop current IBG_LOOP does not exceed the predetermined angle threshold; and, OTHERWISE: IBG_LOOP |
| CG | Zero-Sequence Current Polarization (3I0): If the angle between 3I0 and the CG loop current ICG_LOOP does not exceed the predetermined angle threshold; and OTHERWISE: ICG_LOOP |

For ground quadrilateral negative-sequence resistance blinders, the current polarizing quantity may be a negative-sequence current or a corresponding phase-ground loop current. The polarizing conditions for a ground quadrilateral negative-sequence resistance blinders for AG, BG, and CG fault conditions may be polarized with the corresponding negative-sequence current polarization quantity when an absolute value of an angle between the negative-sequence current and the corresponding phase-ground loop current does not exceed a predetermined threshold, and self-polarized with the corresponding phase-ground loop current otherwise:

| Phases | I2 polarized right resistance blinder |
|---|---|
| AG | Negative-Sequence Phase-Ground Current Polarization (3IA2): If the angle between 3IA2 and the AG loop current IAG_LOOP does not exceed the predetermined angle threshold; and OTHERWISE: IAG_LOOP |
| BG | Negative-Sequence Phase-Ground Current Polarization (3IB2): If the angle between 3IB2 and the BG loop current IBG_LOOP does not exceed the predetermined angle threshold; and OTHERWISE: IBG_LOOP |
| CG | Negative-Sequence Phase-Ground Current Polarization (3IC2): If the angle between 3CG2 and the CG loop current ICG_LOOP does not exceed the predetermined angle threshold; and OTHERWISE: ICG_LOOP |

For ground quadrilateral composite zero-sequence resistance blinders, the current polarizing quantity may be a sum of the positive-sequence and zero-sequence currents, or a corresponding phase-ground loop current. The polarizing conditions for ground quadrilateral composite zero-sequence resistance blinders for AG, BG, and CG fault conditions may be polarized with the corresponding sum of positive and zero-sequence current quantities when an absolute value of an angle between the sum of positive and zero-sequence quantities and the corresponding phase-ground loop current does not exceed a predetermined threshold, and self-polarized with the corresponding phase-ground loop currents otherwise:

| Phases | Composite current polarized right resistance blinder |
|---|---|
| AG | A Sum of the Positive-Sequence and Zero-Sequence Phase Currents (IA1 + 3I0/3): If the angle between the sum and the AG loop current IAG_LOOP does not exceed the predetermined angle threshold; and OTHERWISE: IAG_LOOP |
| BG | A Sum of the Positive-Sequence and Zero-Sequence Phase Currents (IB1 + 3I0/3): If the angle between the sum and the BG loop current IBG_LOOP does not exceed the predetermined angle threshold; and OTHERWISE: IBG_LOOP |
| CG | A Sum of the Positive-Sequence and Zero-Sequence Phase Currents (IC1 + 3I0/3): If the angle between the sum and the CG loop current ICG_LOOP does not exceed the predetermined angle threshold; and OTHERWISE: ICG_LOOP |

For ground quadrilateral composite negative-sequence resistance blinders, the current polarizing quantity may be a sum of the positive-sequence and negative-sequence currents, or a corresponding phase-ground loop current. The polarizing conditions for ground quadrilateral composite negative-sequence resistance blinders for AG, BG, and CG fault conditions may be polarized with the corresponding sum of positive- and negative-sequence current quantities when an absolute value of an angle between the sum of the positive and negative-sequence quantities and the corresponding phase-ground loop current does not exceed a predetermined threshold, and self-polarized with the corresponding phase-ground loop currents otherwise:

| Phases | Composite current polarized right resistance blinder |
|---|---|
| AG | A sum of the Positive-Sequence and Zero-Sequence Phase Currents (IA1 + 3IA2/3): If the angle between the sum and the AG loop current IAG_LOOP does not exceed the predetermined angle threshold; and OTHERWISE: IAG_LOOP |
| BG | A sum of the Positive-Sequence and Zero-Sequence Phase Currents (IB1 + 3IB2/3): If the angle between the sum and the BG loop current IBG_LOOP does not exceed the predetermined angle threshold; and OTHERWISE: IBG_LOOP |
| CG | A sum of the Positive-Sequence and Zero-Sequence Phase Currents (IC1 + 3IC2/3): If the angle between the sum and the BG loop current ICG_LOOP does not exceed the predetermined angle threshold; and OTHERWISE: ICG_LOOP |

Furthermore, the tilt-limiting module may include various timers such that the angle conditions must exist for a predetermined amount of time or number of cycles before the sequence component based current polarizing quantity or the element current is used for polarization.

Figure 6A:
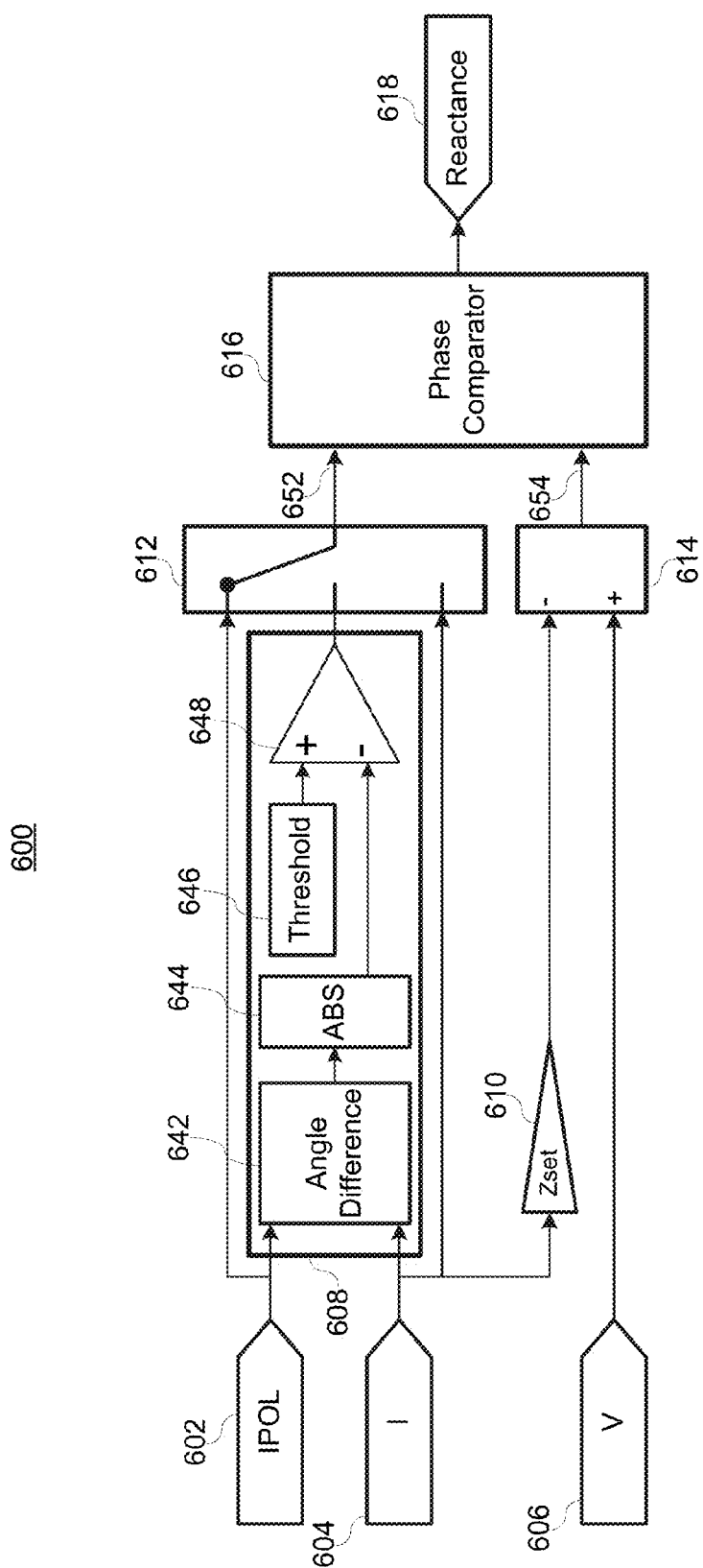
FIG. 6A illustrates a functional diagram of a tilt-limiting module according to several embodiments herein.

FIG. 6A illustrates a functional diagram of a tilt-limiting module according to several embodiments herein. The functional diagram illustrated in FIG. 6A may be used in tilt-limiting module 510 to determine the polarizing quantity. Although FIG. 6A determines the tilt limit for the reactance blinder using an angle difference check, the same logic may be used to determine the tilt limit for the resistance blinders using the corresponding input quantities and settings. The method 600 of FIG. 6A receives the sequence component based polarizing quantity IPOL 602, loop current 604, and voltage 606. A tilt-limiting module 608 uses the polarizing quantity IPOL 602 and the loop current 604 to determine whether the tilt should be limited. The tilt-limiting module includes an angle difference block 642 to determine an angle difference between the polarizing quantity 602 and the loop current 604. An absolute value block 644 determines the absolute value of the angle difference. A predetermined threshold 646 and the absolute value are compared in comparator 648, which outputs a signal switch 612 such that the phase comparator 616 uses the appropriate value as the polarizing quantity 652. If the absolute value of the angle difference does not exceed the predetermined threshold, then comparator 648 signals switch 612 to select the sequence-based polarizing quantity IPOL 602 as the polarizing quantity 652 to the phase comparator 616. Otherwise, the comparator 648 signals the switch 612 to select the loop current 604 as the polarizing quantity 652 for the phase comparator 616. As discussed above, the polarizing quantity 652 may be selected from the sequence based polarizing quantity 602 and the appropriate loop current values 604 according to the embodiments described in more detail hereinabove. For example, for a phase quadrilateral reactance element, the polarizing quantity 602 may be the negative-sequence current, and the current value 604 may be the appropriate loop current value. When the absolute value of the angle between the negative-sequence current polarizing quantity and the corresponding loop current does not exceed a predetermined threshold, then the polarizing quantity 652 may be the negative-sequence current. Otherwise, the polarizing quantity 652 may be the appropriate loop current quantity 604.

The operating quantity 654 may be calculated using the appropriate setting such as Zset 610 for the reactance module and Rset (not separately illustrated) for the resistance module, and the appropriate voltage inputs 606. The phase comparator 616 uses the operating quantity 654 and the polarizing quantity 652 to determine the reactance output 618 according to the various embodiments described in more detail herein.

Figure 6B:
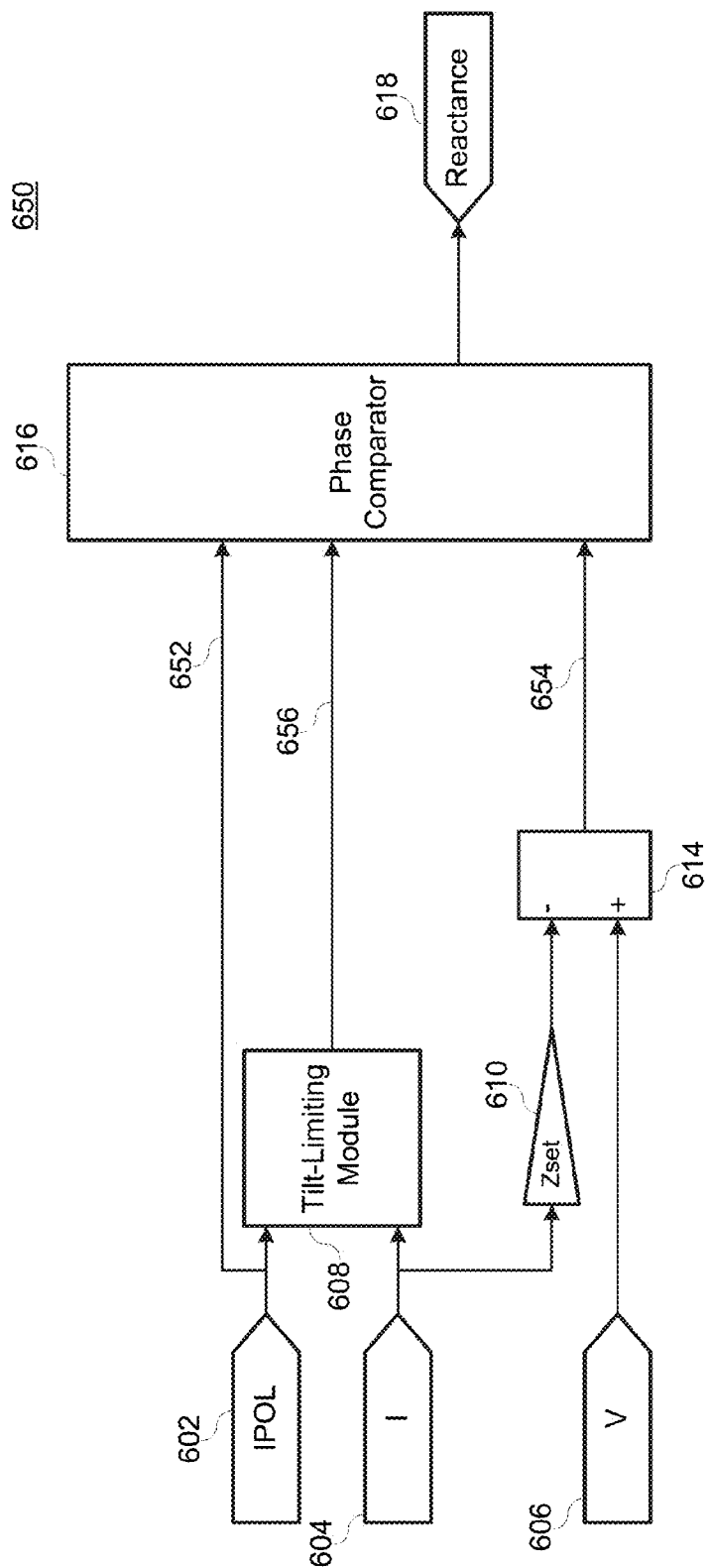
FIG. 6B illustrates a functional diagram of a module for supervising an element according to embodiments herein.

FIG. 6B illustrates another functional diagram of method 650 of supervising a reactance element or resistance blinder according to several embodiments herein. In this embodiment, the reactance element or resistance blinder (phase comparator 616) is enabled when the angle difference between the polarizing quantity 602 and the loop quantity 604 does not exceed a predetermined angle threshold. If the absolute value of the angle between the polarizing quantity 602 and the loop quantity 604 is less than or equal to a predetermined threshold, then the phase comparator 616 is enabled to determine the distance to the fault. Otherwise, the phase comparator 616 is disabled.

For example, if the element is a phase quadrilateral reactance element, the polarizing quantity 602 is a negative-sequence current polarizing quantity, and the loop current 604 is the corresponding phase loop current. The tilt-limiting module 608 outputs an enable signal 656 to the phase comparator 616 when the absolute value of the angle between the negative-sequence current polarizing quantity and the corresponding phase loop current is less than or equal to the predetermined angle threshold. Otherwise, the phase comparator 616 is not enabled.

It should be noted that according to several embodiments herein, if the absolute value of the angle difference does not exceed the predetermined angle conditions, then the sequence component based current polarizing quantity is used, and the element loop current is used otherwise. According to several embodiments, if the absolute value of the angle difference is less than the predetermined angle conditions, then the sequence component based current polarizing quantity may be used, and the element loop current may be used otherwise. Further, the reactance element or resistance blinder phase comparator 616 may be enabled when the angle difference between the polarizing quantity 602 and the loop quantity 604 is less than the predetermined angle threshold.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. Accordingly, many changes may be made to the details of the above-described embodiments without departing from the underlying principles of this disclosure. The scope of the present invention should, therefore, be determined only by the following claims.

What is claimed is:

1. An apparatus to protect an electrical power system comprising:
 a quadrilateral distance module configured to detect a fault in an electric power system using a quadrilateral characteristic, the quadrilateral distance module comprising:
  a tilt-limiting module configured to:
   receive a current polarizing quantity and a loop current quantity,
   calculate an angle between the current polarizing quantity and the loop current quantity, and
   compare the angle between the current polarizing quantity and the loop current quantity with a predetermined threshold; and,
  a phase comparator module configured to:
   when the angle does not exceed the predetermined threshold, detect a fault in the electrical power system using the current polarizing quantity and an operating quantity and,
   when the angle exceeds the predetermined threshold, detect a fault in the electrical power system using the loop current quantity and an operating quantity;
  wherein the quadrilateral distance module is further configured to receive a stimulus from the electrical power system and to compare the stimulus to the quadrilateral characteristic to detect the fault.

2. The apparatus of claim 1, wherein the current polarizing quantity comprises at least one of a negative-sequence current polarizing quantity, a positive-sequence current polarizing quantity, a zero-sequence current polarizing quantity, and a sum of positive-sequence and zero-sequence current polarizing quantities.

3. The apparatus of claim 1, wherein the loop current quantity comprises at least one of a phase-to-phase loop current and a phase-to-ground loop current.

4. The apparatus of claim 1, wherein the phase comparator module comprises a reactance module.

5. The apparatus of claim 1, wherein the phase comparator module comprises a resistance module.

6. The apparatus of claim 1, wherein:
 the quadrilateral characteristic comprises a reactance element; and,
 the current polarizing quantity comprises a negative-sequence current polarizing quantity.

7. The apparatus of claim 6, wherein the loop current quantity comprises a phase-to-phase loop current.

8. The apparatus of claim 1, wherein:
 the quadrilateral characteristic comprises a resistance blinder; and, the current polarizing quantity comprises a positive-sequence current polarizing quantity.

9. The apparatus of claim 8, wherein the loop current quantity comprises a phase-to-phase loop current.

10. The apparatus of claim 1, wherein:
the quadrilateral characteristic comprises a resistance blinder; and,
the current polarizing quantity comprises a negative-sequence current polarizing quantity.

11. The apparatus of claim 10, wherein the loop current quantity comprises a phase-to-phase loop current.

12. The apparatus of claim 1, wherein:
the quadrilateral characteristic comprises a reactance element; and,
the current polarizing quantity comprises a zero-sequence current polarizing quantity.

13. The apparatus of claim 12, wherein the loop current quantity comprises a phase-to-ground loop current.

14. The apparatus of claim 1, wherein:
the quadrilateral characteristic comprises a reactance element; and,
the current polarizing quantity comprises a negative-sequence current polarizing quantity.

15. The apparatus of claim 14, wherein the loop current quantity comprises a phase-to-ground loop current.

16. The apparatus of claim 1, wherein:
the quadrilateral characteristic comprises a resistance blinder; and,
the current polarizing quantity comprises a zero-sequence current polarizing quantity.

17. The apparatus of claim 16, wherein the loop current quantity comprises a phase-to-ground loop current.

18. The apparatus of claim 1, wherein:
the quadrilateral characteristic comprises a resistance blinder; and,
the current polarizing quantity comprises a negative-sequence current polarizing quantity.

19. The apparatus of claim 18, wherein the loop current quantity comprises a phase-to-ground loop current.

20. The apparatus of claim 1, wherein:
the quadrilateral characteristic comprises a resistance blinder; and,
the current polarizing quantity comprises a composite of a positive-sequence and a zero-sequence current polarizing quantity.

21. The apparatus of claim 20, wherein the loop current quantity comprises a phase-to-ground loop current.

22. The apparatus of claim 1, wherein:
the quadrilateral characteristic comprises a resistance blinder; and,
the current polarizing quantity comprises a composite of a positive-sequence and a negative-sequence current polarizing quantity.

23. The apparatus of claim 22, wherein the loop current quantity comprises a phase-to-ground loop current.

24. An apparatus to protect an electric power system, comprising:
a phase quadrilateral distance module configured to detect a fault in an electric power system using a quadrilateral characteristic, the phase quadrilateral distance module comprising:
a phase comparator to define an adaptive quadrilateral element comprising an adaptive reactance element and an adaptive resistance blinder; and,
a tilt-limiting module to limit an adaptive tilt of at least one component of the quadrilateral element by:
defining a polarizing quantity used by the phase comparator as a polarizing current quantity only when an angle between the polarizing current quantity and a corresponding loop current quantity does not exceed a predetermined threshold, and
disabling the phase comparator when the angle is greater than the predetermined threshold;
wherein the quadrilateral distance module is configured to detect the fault in the electrical power system by comparing the quadrilateral characteristic and a stimulus obtained from the electrical power system.

25. The apparatus of claim 24, wherein the phase comparator comprises a reactance element and the corresponding loop current comprises a phase-to-phase loop current.

26. The apparatus of claim 24, wherein the phase comparator comprises a resistance blinder and the corresponding loop current comprises a phase-to-phase loop current.

27. The apparatus of claim 24, wherein the phase comparator comprises a reactance blinder and the corresponding loop current comprises a phase-to-ground loop current.

28. The apparatus of claim 24, wherein the phase comparator comprises a resistance blinder and the corresponding loop current comprises a phase-to-ground loop current.

* * * * *